United States Patent
Gao et al.

(10) Patent No.: US 7,705,682 B2
(45) Date of Patent: Apr. 27, 2010

(54) INDUCTOR SHARING IN RADIO FREQUENCY COMMUNICATIONS

(75) Inventors: Minzhan Gao, Cupertino, CA (US); Ann P. Shen, Saratoga, CA (US); Chien-Meen Hwang, San Jose, CA (US)

(73) Assignee: NanoAmp Mobile, Inc., Santa Clara, CA (US)

( * ) Notice: Subject to any disclaimer, the term of this patent is extended or adjusted under 35 U.S.C. 154(b) by 0 days.

(21) Appl. No.: 12/237,132

(22) Filed: Sep. 24, 2008

(65) Prior Publication Data

US 2009/0085668 A1    Apr. 2, 2009

Related U.S. Application Data

(60) Provisional application No. 60/975,741, filed on Sep. 27, 2007.

(51) Int. Cl.
*H03F 3/68* (2006.01)
(52) U.S. Cl. .................... 330/295; 330/124 R; 330/283
(58) Field of Classification Search .................. 330/51, 330/283, 295, 306, 310, 126
See application file for complete search history.

(56) References Cited

U.S. PATENT DOCUMENTS

| | | | |
|---|---|---|---|
| 3,703,685 A | 11/1972 | Simopoulos et al. | |
| 5,021,745 A | 6/1991 | Kondou et al. | |
| 5,872,489 A | 2/1999 | Chang et al. | |
| 6,292,378 B1 | 9/2001 | Brooks et al. | |
| 6,304,206 B1 | 10/2001 | Wada et al. | |
| 6,417,737 B1 | 7/2002 | Moloudi et al. | |
| 6,472,936 B1 | 10/2002 | Jones | |
| 6,704,559 B1 | 3/2004 | Hageraats | |
| 6,816,718 B2 | 11/2004 | Yan et al. | |
| 6,867,649 B2 | 3/2005 | Lehto | |
| 7,019,593 B2 | 3/2006 | Krishnasamy Maniam et al. | |
| 7,079,860 B1 | 7/2006 | Yamamoto et al. | |
| 7,233,772 B1 | 6/2007 | Darabi et al. | |
| 7,486,135 B2 * | 2/2009 | Mu | 330/51 |
| 7,521,996 B2 | 4/2009 | Kluge | |
| 2005/0093630 A1 | 5/2005 | Whittaker et al. | |
| 2005/0174175 A1 | 8/2005 | Heigelmayer et al. | |

(Continued)

FOREIGN PATENT DOCUMENTS

JP    5-83049    4/1993

(Continued)

OTHER PUBLICATIONS

PCT International Search Report and Written Opinion issued in International Application No. PCT/US2008/077690 mailed Jan. 9, 2009, 11 pages.

(Continued)

*Primary Examiner*—Robert Pascal
*Assistant Examiner*—Hieu P Nguyen
(74) *Attorney, Agent, or Firm*—Fish & Richardson P.C.

(57) ABSTRACT

Two or more low noise amplifiers are configured to amplify received radio frequency input signals and one or more shared load or source degeneration inductors are configured to be used for each of the two or more low noise amplifiers. Further, the one or more shared inductors can be configured to be used for processing two or more signal bands in a multi-band communication system.

54 Claims, 16 Drawing Sheets

U.S. PATENT DOCUMENTS

2009/0085671 A1    4/2009    Shen

FOREIGN PATENT DOCUMENTS

| JP | 8-139534 | 5/1996 |
| JP | 2006-262265 | 9/2006 |
| WO | WO 2009/042777 | 4/2009 |

OTHER PUBLICATIONS

Office Action issued in U.S. Appl. No. 12/236,344 dated Sep. 29, 2009.

PCT International Search Report and Written Opinion issued in International Application No. PCT/US2008/077493, dated Jan. 8, 2009, 12 pages.

* cited by examiner

INDUCTOR SHARING IN RADIO FREQUENCY COMMUNICATIONS

CROSS REFERENCE TO RELATED APPLICATIONS

This application claims the benefit of priority from U.S. Provisional Application entitled "INDUCTOR SHARING IN RADIO FREQUENCY COMMUNICATIONS," application Ser. No. 60/975,741 filed Sep. 27, 2007, the disclosure of which is incorporated by reference.

TECHNICAL FIELD

This disclosure relates to the use of inductors in radio frequency circuitry.

SUMMARY

In general, some implementations feature a method that includes receiving a first input signal at a first terminal of a first amplifier, and amplifying the first input signal using the first amplifier. The first amplifier is coupled to one or more source degeneration inductors at a second terminal of the first amplifier. The method includes receiving a second input signal at a first terminal of a second amplifier, and amplifying the second input signal using the second amplifier. The second amplifier is coupled to the one or more source degeneration inductors at a second terminal of the second amplifier.

These and other implementations can optionally include one or more of the following features. The first amplifier can be coupled to one or more load inductors at a third terminal of the first amplifier and the second amplifier can be coupled to the one or more load inductors at a third terminal of the second amplifier. The third terminal of the first amplifier can be coupled to the third terminal of the second amplifier. The method can include receiving a third input signal at a first terminal of a third amplifier, and amplifying the third input signal using the third amplifier. The third amplifier can be coupled to the one or more source degeneration inductors at a second terminal of the third amplifier and can be coupled to the one or more load inductors at a third terminal of the third amplifier. The method can include receiving a fourth input signal at a first terminal of a fourth amplifier, and amplifying the fourth input signal using the fourth amplifier. The fourth amplifier can be coupled to the one or more source degeneration inductors at a second terminal of the fourth amplifier and can be coupled to the one or more load inductors at a third terminal of the fourth amplifier. The one or more load inductors can be coupled to the third terminal of the third amplifier and the third terminal of the fourth amplifier through one or more switches. The one or more source degeneration inductors can be coupled to the second terminal of the third amplifier and the second terminal of the fourth amplifier through one or more switches. The third terminal of the third amplifier and the third terminal of the fourth amplifier can be coupled to one or more load capacitors through one or more switches. The second terminal of the third amplifier and the second terminal of the fourth amplifier can be coupled to one or more gate-source capacitors through one or more switches. The method can involve receiving a third input signal at a first terminal of a third amplifier, and amplifying the third input signal using the third amplifier. The third amplifier can be coupled to the one or more load inductors and can be coupled to the one or more source degeneration inductors. The method can involve receiving a fourth input signal at a first terminal of a fourth amplifier, and amplifying the fourth input signal using the fourth amplifier. The fourth amplifier can be coupled to the one or more load inductors and can be coupled to the one or more source degeneration inductors. The one or more source degeneration inductors can be a first set of one or more source degeneration inductors, the third amplifier can be coupled to a second set of one or more source degeneration inductors at a second terminal of the third amplifier, and the fourth amplifier can be coupled to the second set of one or more source degeneration inductors at a second terminal of the fourth amplifier. The second set of one or more source degeneration inductors can be coupled to the first set of one or more source degeneration inductors through one or more switches. The one or more load inductors can be a first set of one or more load inductors, the third amplifier can be coupled to a second set of one or more load inductors at a third terminal of the third amplifier, and the fourth amplifier can be coupled to the second set of one or more load inductors at a third terminal of the fourth amplifier. The second set of one or more load inductors can be coupled to the first set of one or more load inductors through one or more switches. The one or more source degeneration inductors can include a first set of one or more source degeneration inductors, the third amplifier can be coupled to a second set of one or more source degeneration inductors at a second terminal of the third amplifier, and the fourth amplifier can be coupled to the second set of one or more source degeneration inductors at a second terminal of the fourth amplifier. The one or more load inductors can include a first set of one or more load inductors, the third amplifier can be coupled to a second set of one or more load inductors at a third terminal of the third amplifier, and the fourth amplifier can be coupled to the second set of one or more load inductors at a third terminal of the fourth amplifier. The second terminal of the first amplifier can be coupled to the second terminal of the second amplifier, the third terminal of the first amplifier can be coupled to the third terminal of the second amplifier, the second terminal of the third amplifier can be coupled to the second terminal of the fourth amplifier, and the third terminal of the third amplifier can be coupled to the third terminal of the fourth amplifier. The method can involve disabling the first amplifier during a time period in which the second amplifier is amplifying the second input signal. The method can involve disabling the first amplifier including switching the first terminal of the first amplifier to ground. The amplification of the first or second input signals can include using a control circuit, in which the control circuit can be configured to control a first switch such that the first amplifier is active concurrent with controlling a second switch such that that the second amplifier is not active. The control circuit can be configured to not activate the first amplifier and the second amplifier concurrently. The amplification of the first input signal using the first amplifier can include amplifying the first input signal only at times when the second amplifier is not active. The first amplifier can be dedicated to a first frequency band and the second amplifier can be dedicated to a second, different, frequency band. The first and second amplifiers can be low noise amplifiers. The second terminal of the first amplifier can be coupled to the second terminal of the second amplifier and the third terminal of the first amplifier can be coupled to the third terminal of the second amplifier.

In general, some implementations feature a method that includes coupling a first input terminal to a first terminal of a first amplifier, coupling at least one source degeneration inductor to a second terminal of the first amplifier, coupling a second input terminal to a first terminal of a second amplifier, and coupling the at least one source degeneration inductor to a second terminal of the second amplifier.

These and other embodiments can optionally include one or more of the following features. The method can include coupling at least one load inductor to a third terminal of the first amplifier and to a third terminal of the second amplifier. The method can include coupling a third input terminal to a first terminal of a third amplifier, coupling the at least one load inductor to the third amplifier, coupling the at least one source degeneration inductor to the third amplifier, coupling a fourth input terminal to a first terminal of a fourth amplifier, coupling the at least one load inductor to the fourth amplifier, and coupling the at least one source degeneration inductor to the fourth amplifier. At least one load inductor can be a first set of one or more load inductors. The third amplifier can be coupled to a second set of one or more load inductors at a third terminal of the third amplifier, and the fourth amplifier can be coupled to the second set of one or more load inductors at a third terminal of the fourth amplifier. The second set of one or more load inductors can be coupled to the first set of one or more load inductors through one or more switches. The at least one load inductor can be coupled to the third terminal of the third amplifier and the third terminal of the fourth amplifier through one or more switches. The at least one source degeneration inductor can be a first set of one or more source degeneration inductors, the third amplifier can be coupled to a second set of one or more source degeneration inductors at a second terminal of the third amplifier, and the fourth amplifier can be coupled to the second set of one or more source degeneration inductors at a second terminal of the fourth amplifier. The second set of one or more source degeneration inductors can be coupled to the second terminal of the third amplifier and the second terminal of the fourth amplifier through one or more switches. A second terminal of the fourth amplifier can be coupled to a second terminal of the third amplifier and the at least one source degeneration inductor through one or more switches. At least one load inductor can be a first set of one or more load inductors. The third amplifier can be coupled to a second set of one or more load inductors at a third terminal of the third amplifier, and the fourth amplifier can be coupled to the second set of one or more load inductors at a third terminal of the fourth amplifier. The at least one source degeneration inductor can be a first set of one or more source degeneration inductors, the third amplifier can be coupled to a second set of one or more source degeneration inductors at a second terminal of the third amplifier, and the fourth amplifier can be coupled to the second set of one or more source degeneration inductors at a second terminal of the fourth amplifier. The second terminal of the first amplifier can be coupled to the second terminal of the second amplifier, the third terminal of the first amplifier can be coupled to the third terminal of the second amplifier, the second terminal of the third amplifier can be coupled to the second terminal of the fourth amplifier, and the third terminal of the third amplifier can be coupled to the third terminal of the fourth amplifier. The first amplifier can be dedicated to a first frequency band and the second amplifier can be dedicated to a second, different, frequency band. The method can include coupling a first output of a control circuit to a first switch. The control circuit can be configured to use the first switch to switch between coupling or not coupling the first terminal of the first amplifier to ground. The method can involve coupling a second output of the control circuit to a second switch. The control circuit can be configured to use the second switch to switch between coupling or not coupling the first terminal of the second amplifier to ground. The control circuit can be configured to always couple at least one of the first terminal of the first amplifier and the first terminal of the second amplifier to ground. The first and the second amplifiers can include low noise amplifiers. The first and second input terminals can be each differential input terminals, the first terminal of the first amplifier can be a differential terminal, and the first terminal of the second amplifier can be a differential terminal. The coupling of the at least one load inductor to the third terminal of the first amplifier and the third terminal of the second amplifier can include coupling a pair of load inductors to a third differential terminal of the first amplifier and a third differential terminal of the second amplifier. The coupling of the at least one source degeneration inductor to the second terminal of the first amplifier and the second terminal of the second amplifier can include coupling a pair of source degeneration inductors to a second differential terminal of the first amplifier and a second differential terminal of the second amplifier. The method can include coupling the second terminal of the first amplifier to the second terminal of the second amplifier.

In general, some implementations feature a circuit that includes a first terminal of a first amplifier coupled to a first input terminal, and at least one source degeneration inductor coupled to a second terminal of the first amplifier. The circuit includes a first terminal of a second amplifier coupled to a second input terminal, and a second terminal of the second amplifier coupled to the at least one source degeneration inductor.

These and other implementations can optionally include one or more of the following features. At least one source degeneration inductor can be coupled to the second terminal of the first amplifier and the second terminal of the second amplifier through one or more switches. The circuit can include at least one load inductor coupled to a third terminal of the first amplifier and a third terminal of the second amplifier. The circuit can include a first terminal of a third amplifier coupled to a third input terminal, in which the third amplifier can be coupled to the at least one source degeneration inductor and can be coupled to the at least one load inductor. The circuit can include a first terminal of a fourth amplifier coupled to a fourth input terminal, in which the fourth amplifier can be coupled to the at least one source degeneration inductor and can be coupled to the at least one load inductor. A second terminal of the third amplifier and a second terminal of the fourth amplifier can be coupled to one or more gate-source capacitors through one or more switches. A third terminal of the third amplifier and a third terminal of the fourth amplifier can be coupled to one or more load capacitors through one or more switches. At least one load inductor can be a first set of one or more load inductors, the third amplifier can be coupled to a second set of one or more load inductors at a third terminal of the third amplifier, and the fourth amplifier can be coupled to the second set of one or more load inductors at a third terminal of the fourth amplifier. The second set of one or more load inductors can be coupled to the first set of one or more load inductors through one or more switches. The at least one load inductor can be coupled to a third terminal of the third amplifier and a third terminal of the fourth amplifier through one or more switches. At least one source degeneration inductor can be a first set of one or more source degeneration inductors, the third amplifier can be coupled to a second set of one or more source degeneration inductors at the second terminal of the third amplifier, and the fourth amplifier can be coupled to the second set of one or more source degeneration inductors at the second terminal of the fourth amplifier. The second set of one or more source degeneration inductors can be coupled to the first set of one or more source degeneration inductors through one or more switches. The second set of one or more source degeneration inductors can be coupled to the second terminal of the third amplifier and the second terminal of the fourth amplifier through one or more switches. The at least one load inductor can be a first set of one or more load inductors, the third amplifier can be coupled to a second set of one or more load inductors at a third terminal of the third amplifier, and the fourth amplifier can be coupled to the second set of one or more load inductors at a third terminal of the fourth amplifier. The one or more source degeneration inductors can be a first set of one or more source degeneration inductors, the third amplifier can be coupled to a second set of one or more source degeneration inductors at a second terminal of the third amplifier, and the fourth amplifier can be coupled to the second set of one or more source degeneration inductors at a second terminal of the fourth amplifier. The second terminal of the first amplifier can be coupled to the second terminal of the second amplifier, the third terminal of the first amplifier can be coupled to the third terminal of the second amplifier, the second terminal of the third amplifier can be coupled to the second terminal of the fourth amplifier, and the third terminal of the third amplifier can be coupled to the third terminal of the fourth amplifier. The second set of one or more load inductors can be coupled to the first set of one or more load inductors through one or more load inductor switches and the second set of one or more source degeneration inductors can be coupled to the first set of one or more source degeneration inductors through one or more source inductor switches. The circuit can include a control circuit with an input terminal coupled to a baseband to receive instructions from the baseband, a first switch coupled to the control circuit and configured to switch between coupling or not coupling the first terminal of the first amplifier to ground, and a second switch coupled to the control circuit and configured to switch between coupling or not coupling the first terminal of the second amplifier to ground. The control circuit can be configured to always couple at least one of the first terminal of the first amplifier and the first terminal of the second amplifier to ground when amplification is being conducted. The control circuit can be configured to control the first switch such that the first amplifier is active concurrently with controlling the second switch such that that the second amplifier is not active. The control circuit can be configured to not activate the first amplifier and the second amplifier concurrently. The first and the second amplifiers can be low noise amplifiers. The first and second input terminals can be differential input terminals, the first terminal of the first amplifier can be a differential terminal, and the first terminal of the second amplifier can be a second differential terminal. The first amplifier can be dedicated to a first frequency band and the second amplifier is dedicated to a second, different, frequency band. The second terminal of the first amplifier can be coupled to the second terminal of the second amplifier and the third terminal of the first amplifier can be coupled to the third terminal of the second amplifier.

The described implementations may be compatible with digital algorithms used in communication systems. Some implementations also may, for example, provide for reducing cost, power and size of circuitry.

The details of one or more implementations are set forth in the accompanying drawings and the description below. Other features will be apparent from the description and drawings, and from the claims.

DETAILED DESCRIPTION

Figure 1:
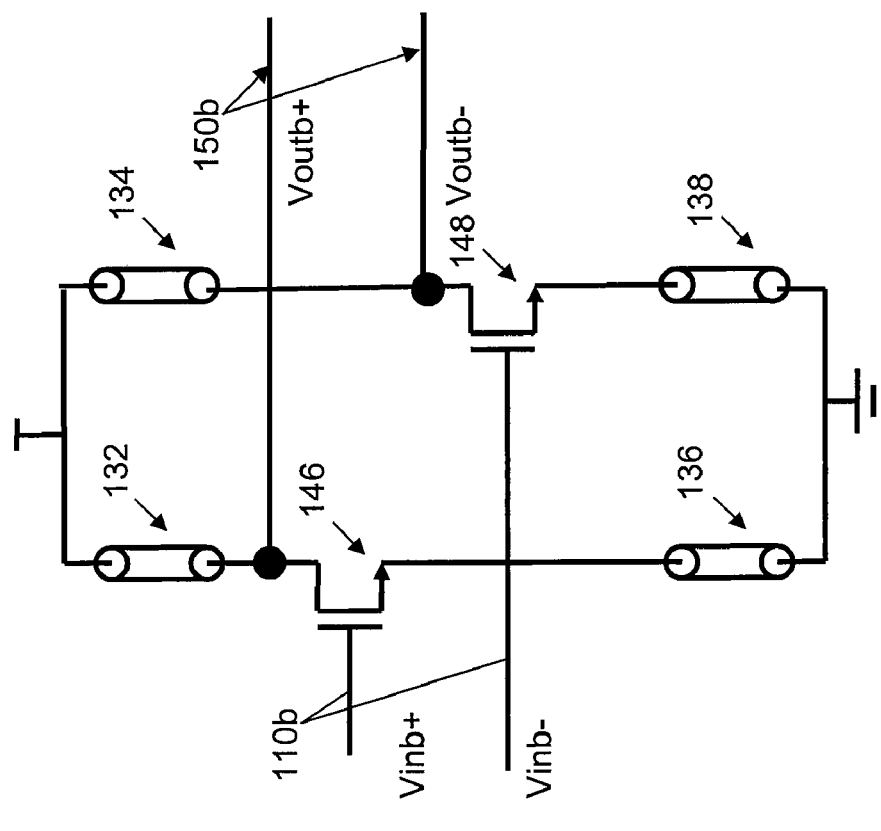
FIG. 1 is a schematic of an example of a circuit with dedicated inductors.
Figure 1:
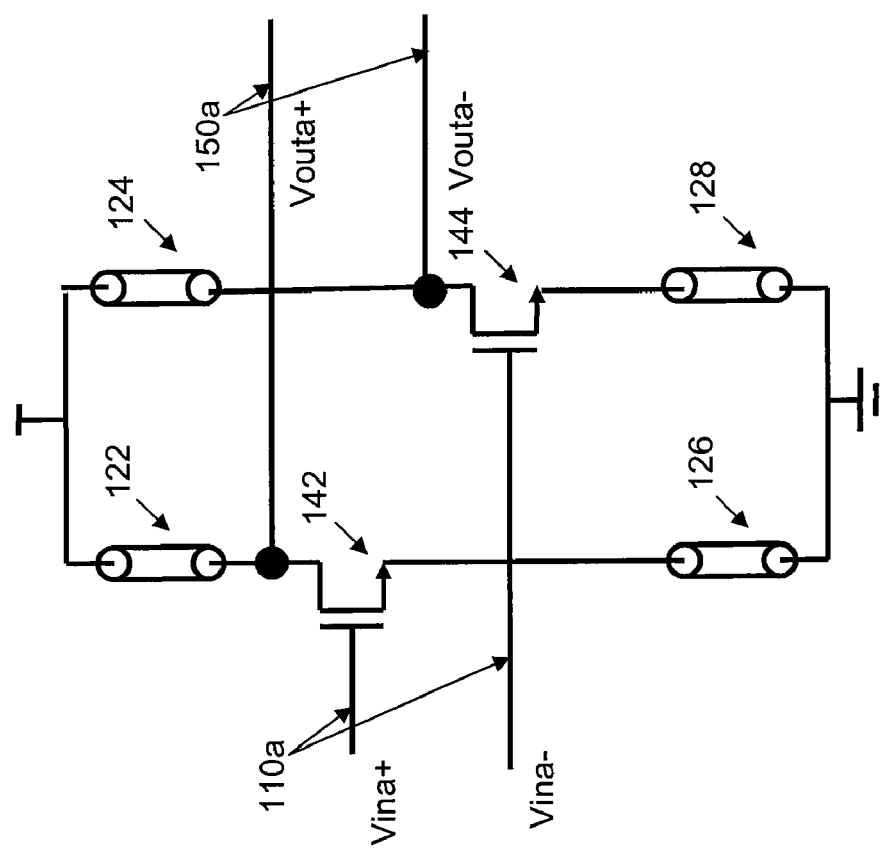

In multi-band and multi-standard receivers, transmitters, or transceivers, a low-noise amplifier (LNA) circuit can be included for each frequency band, with each LNA having separate source degeneration and load inductors. By not including multiple source degeneration and load inductors with LNAs, the required space and cost of the circuit may decrease and less power may be consumed. Accordingly, two or more source degeneration and/or load inductors for close frequencies can be shared through, for example, directly or indirectly electrically connecting the source degeneration inductors, load inductors, gate-source capacitors and/or load capacitors to multiple circuit components.

Although varying by circuit parameters, frequencies may be considered close when, for example, if the difference of the center frequencies of the frequency bands, $f_{cdiff}$, is less than or near a limiting frequency bandwidth, $f_{lbw}$. In this case, the direct source degeneration or load inductor sharing described below can be used for the LNAs. The difference of the center frequencies of the bands $f_{cdiff}$ is equal to $f_{ch}-f_{cl}$ wherein $f_{ch}$ and $f_{cl}$ are the center frequencies of a highest and a lowest frequency bands, respectively. The highest frequency band has a bandwidth of $f_{bwh}$ and the lowest frequency band has a bandwidth of $f_{bwl}$.

For some implementations, the limiting frequency bandwidth $f_{lbw}$ is a function of a quality factor $Q_t$ of the load inductor circuit or the source degeneration inductor circuit, the center frequencies $f_{ch}$ and $f_{cl}$, and the respective frequency bandwidths $f_{bwh}$ and $f_{bwl}$, i.e., $f_{lbw}$=function($Q_t,f_{ch},f_{cl},f_{bwh},f_{bwl}$). In other implementations, the limiting bandwidth $f_{lbw}$ can be $(f_{bwh}+f_{bwl})/2$. The load inductor circuit has a quality factor $Q_{tl}$ and the source inductor circuit has a quality factor $Q_{ts}$. The limiting bandwidth $f_{lbw}$ can be obtained by using the above function with both $Q_{tl}$ and $Q_{ts}$ and taking the smaller value as the limiting frequency bandwidth $f_{lbw}$. As an example for the GSM 850 MHz and EGSM 900 MHz bands, their center frequencies are $f_{ch}$=942.5 MHz and $f_{cl}$=881.5 MHz and the difference of the center frequencies is $f_{cdiff}$=61 MHz. The limiting frequency bandwidth $f_{lbw}$ can have a value of 61.5 MHz for $Q_t$ around 10. Since $f_{cdiff}$ is less than $f_{lbw}$ for the GSM 850 and EGSM 900 bands, the source degeneration inductor sharing or the load inductor sharing separately or combined can be applied. For example, the same load and/or source inductors can be shared by both LNAs. The values of the shared source degeneration inductor and/or load inductor described above can be obtained by different estimation methods and/or by engineering design aid circuit software simulation.

For frequency bands not close, such as where the difference of the center frequencies more than the limiting frequency bandwidth $f_{lbw}$ (e.g. GSM 850 MHz and DCS 1800 MHz bands), source degeneration and/or load inductors can be selectively shared through inductor and/or capacitor switching. For example, the load and/or source inductors for the high frequency LNA can be switched in as part of the low frequency LNA inductors to provide the total inductance for the low frequency LNA. Furthermore, direct load and/or source degeneration inductor sharing can be employed for frequency bands having the difference of center frequencies more than the limiting frequency bandwidth $f_{lbw}$, by employing switching load and/or gate-source capacitors. For example, the same load and/or source inductors can be shared by both LNAs when the difference is greater than $f_{lbw}$ by employing switching load and/or source capacitors.

As an example of GSM 850 MHz and DCS 1800 MHz bands, their center frequencies are $f_{ch}$=1747.5 MHz and $f_{cl}$=881.5 MHz and the difference of the center frequencies is $f_{cdiff}$=961 MHz. The limiting frequency bandwidth $f_{lbw}$ can have a value of 87.5 MHz for $Q_t$ of approximately 10. Since $f_{cdiff}$ is much bigger than $f_{lbw}$ for the GSM 850 MHz and DCS 1800 MHz bands, the source degeneration inductor sharing or the load inductor sharing separately or combined can be applied through switching of inductors and/or capacitors.

In addition, the techniques of the switched inductors and/or switched capacitors can be employed for frequency bands with center frequency difference $f_{cdiff}$ within the limiting frequency bandwidth $f_{lbw}$.

Such techniques can be used in, for example, Global System for Mobile Communication (GSM), Extended Global System for Mobile Communication (EGSM), Digital Cellular System (DCS) and Personal Communications Services (PCS) communications standards. For example, various implementations in quad-band communication standards such as GSM, EGSM, DCS and PCS bands, may be able to reduce required cost and power consumption of the LNA by approximately 60% as compared to using dedicated inductors. The source degeneration and load inductor sharing techniques also can be used in, for example, multiple stage cascode topology, a single transistor or other topology LNAs, both I and Q phases of the signals, wireline or wireless RF transceivers for 2 or more close frequency bands, and/or 2G, 3G, 4G, WiFi, WiMax, mobile TV, Bluetooth wireless standards.

FIG. 1 is an example schematic of a circuit 100 with dedicated inductors. The circuit 100 can represent components for processing two bands within a multi-band receiver and includes two inputs 110a and 110b, inductors 122-138, transistors 142-148, and two outputs 150a and 150b. The two inputs 110a and 110b can follow the antenna or one or more RF filters, such as a surface acoustic wave (SAW) band select filter. The two outputs 150a and 150b have output amplified signals of multiple different bands and can be connected to one or more following mixers.

Transistors 142 and 144 represent a first LNA which uses a first set of source degeneration inductors 126 and 128 and load inductors 122 and 124. Transistors 146 and 148 represent a second LNA which uses a second set of source degeneration inductors 136 and 138 and load inductors 132 and 134. As such, the circuit 100 requires space and power for the eight load inductors 122-138.

Figure 2A:
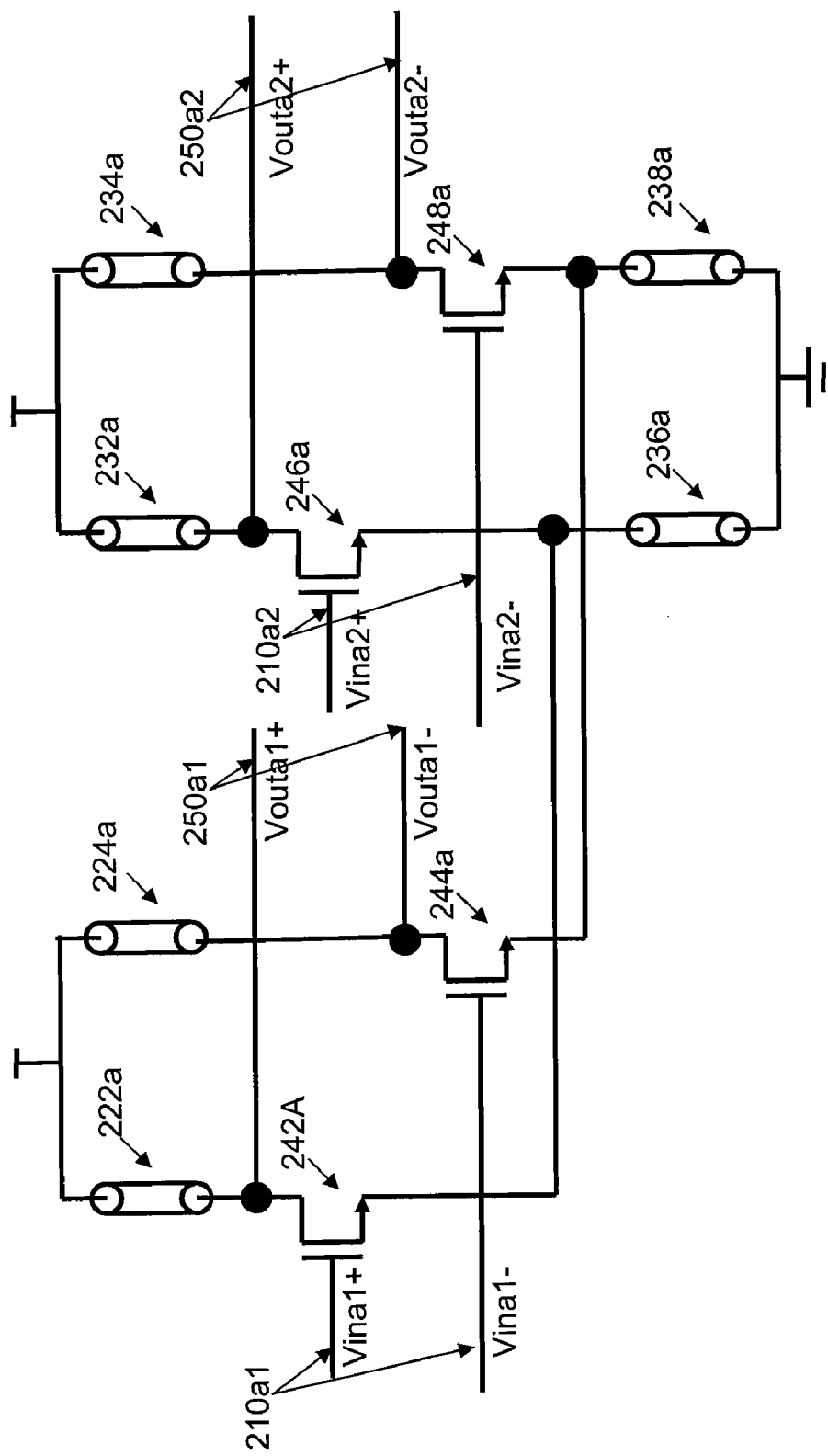
FIG. 2A and FIG. 2B are schematics of examples of circuits employing source degeneration inductor sharing.

FIG. 2A is an example schematic of a circuit 200A employing source degeneration inductor sharing and may be used, for example, for frequency bands which have center frequencies within a limiting frequency bandwidth $f_{lbw}$. The circuit 200A can represent components for processing two bands within a multi-band receiver and includes two inputs 210a1 and 210a2, inductors 222a, 224a, and 232a-238a, transistors 242a-248a, and two outputs 250a1 and 250a2. The two inputs 210a1 and 210a2 can follow an antenna or one or more RF filters, such as a SAW band select filter. The outputs 250a1 and 250a2 have output amplified signals of multiple different bands and can be connected to one or more following mixers.

Transistors 242a and 244a represent a first LNA which uses a first set of inductors. The first set of inductors includes dedicated load inductors 222a and 224a and shared source degeneration inductors 236a and 238a. Transistors 246a and 248a represent a second LNA which uses a second set of inductors. The second set of inductors includes shared source degeneration inductors 236a and 238a and includes dedicated load inductors 232a and 234a. Therefore, the shared source degeneration inductors 236a and 238a are used by both the first and second LNAs. As such, the circuit 200A can require less available space and power for the source degeneration inductors of the first and second LNAs than the circuit 100 of FIG. 1.

In various implementations, when the first LNA is active, the second LNA is shut off with transistors 246a and 248a acting like open circuits. A non-active LNA can be shut-off using various methods, such as, switching an input of the LNA to ground, disconnecting the load inductors, or disconnecting the power supply. These are merely examples of methods for shutting off an LNA. In various implementations, the methods and circuits can be applied to LNAs to use GSM 850 MHz and GSM 900 MHz frequency bands, DCS 1800 MHz frequency and PCS 1900 MHz frequency bands, WCDMA frequency bands, or other close frequency bands.

Figure 2B:
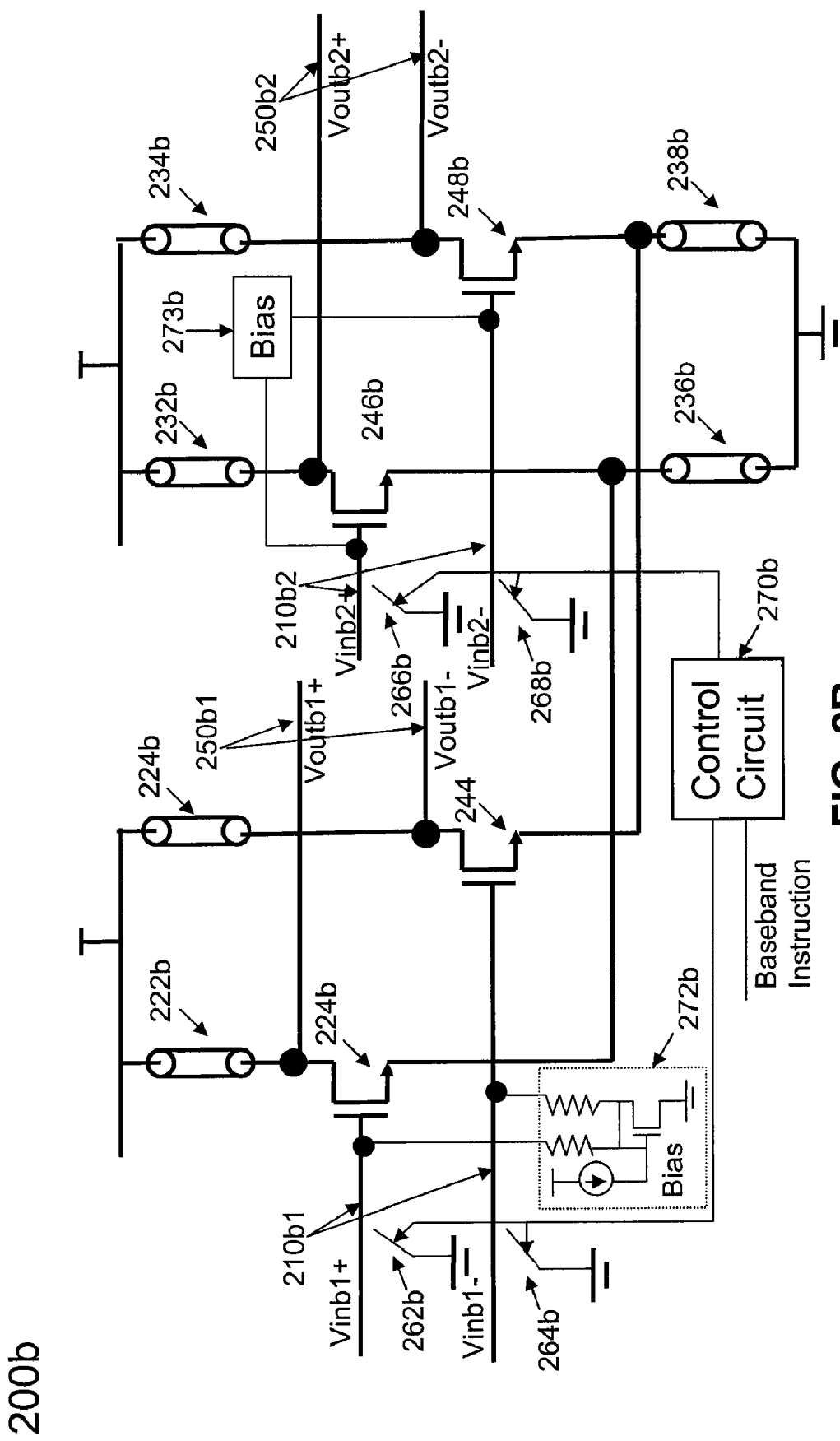

The circuit 200B in FIG. 2B is similar to the circuit 200A shown in FIG. 2A, but shares source degeneration inductors of two frequency bands through use of a control circuit 270b to deactivate the LNAs by grounding the LNA inputs. In some cases, elements of FIG. 2B, which are similar or correspond to elements of FIG. 2A, may use similar reference numerals to FIG. 2A. Also, similar reference numerals may be used for elements of later figures, which may be similar to or may correspond to elements of one or more other figures. The control circuit 270b can receive instructions from a baseband to activate or deactivate an LNA. In one radio receiver system, the LNAs can be normally deactivated until a baseband instruction is received by the control circuit 270b to activate a particular LNA. Switches 262b-268b are controlled by the control circuit 270b.

In particular, when the switches 262b-268b are switched to a first state of a closed position, the inputs of the first and the second LNAs are connected to a ground through the switches 262b-268b to deactivate the LNAs. When the baseband instructs the control circuit 270b to activate the first LNA, the switches 262b and 264b are switched to a second state of an open position to disconnect the input 210b1 of the first LNA from ground. Generally, when the switches 262b and 264b are switched to the second state, the switches 266b and 268b remain in a first state of the closed position to connect the input 210b2 of the second LNA to ground to shut off the second LNA.

Circuit 200B also includes bias circuits 272b and 273b for providing reference voltage to the inputs 210b1 and 210b2 of the first and the second LNAs. The reference voltages of the bias circuit 272b can be the same as the reference voltage 273b, and, in some implementations, a single bias circuit is used.

Figure 3:
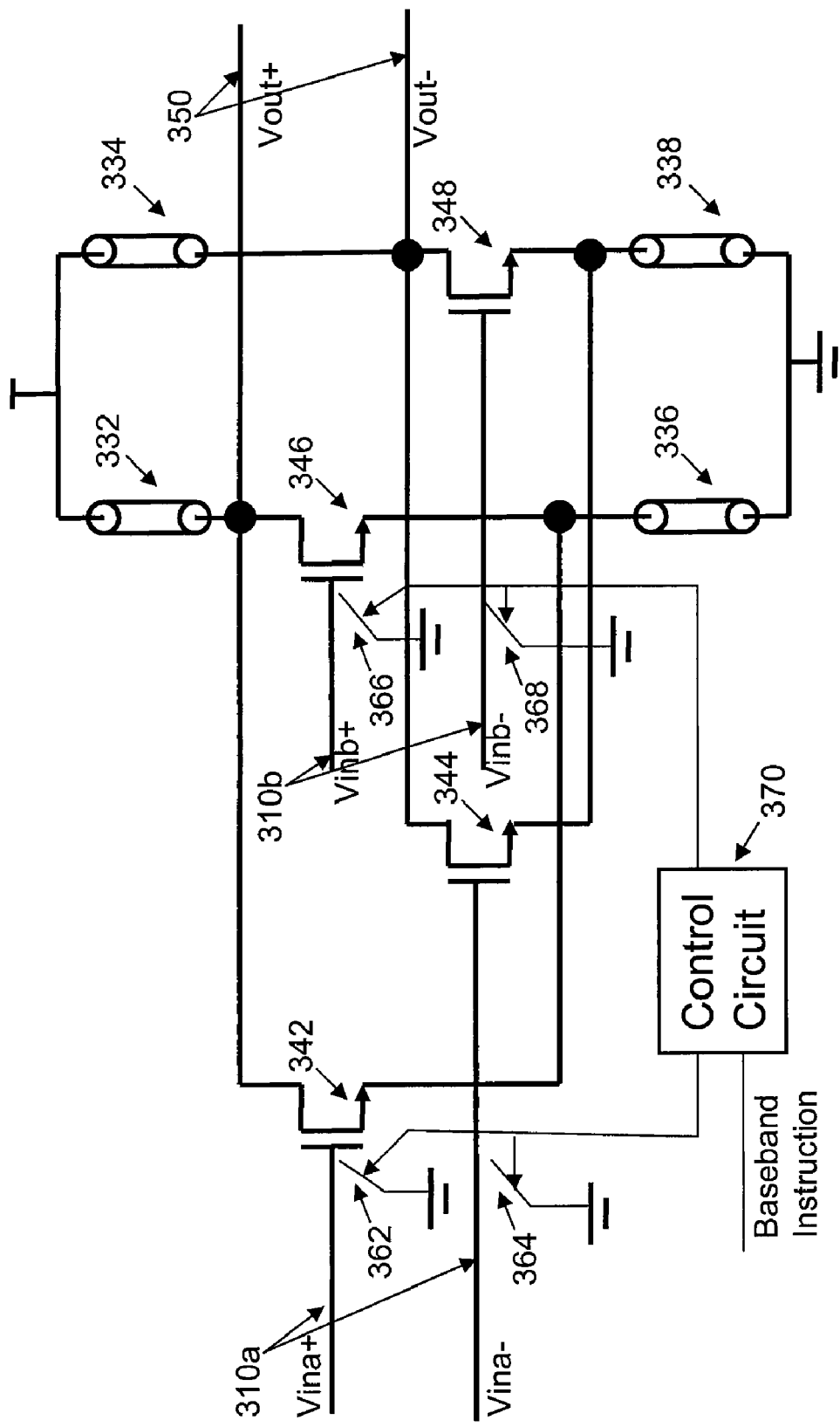
FIG. 3 is a schematic of an example of a circuit employing source degeneration inductor sharing and load inductor sharing.

FIG. 3 is an example schematic of a circuit 300 employing both source degeneration inductor sharing and load inductor sharing. The circuit 300 of FIG. 3 is similar to the circuit 200B of FIG. 2 but employs sharing of both load and source degeneration inductors for close frequency bands. The circuit 300 can represent components for processing two bands within a multi-band receiver and includes two inputs 310a and 310b, shared inductors 332-338, transistors 342-348, and one output 350. The two inputs 310a and 310b can follow the antenna or one or more RF filters, such as a SAW band select filter. The output 350 has amplified signals of multiple different bands and can be connected to one or more following mixers. FIG. 3 also shows a control circuit 370b to activate or deactivate the LNAs by switching the LNA inputs 310a and 310b to ground or the respective input signal by altering the state of the switches 362-368, respectively when one LNA is active, the other LNA is deactivated.

Transistors 342 and 344 represent a first LNA which uses shared load inductors 332 and 334 and shared source degeneration inductors 336 and 338. Transistors 346 and 348 represent a second LNA which also uses the shared load inductors 332 and 334 and the shared source degeneration inductors 336 and 338. As such, both the shared load inductors 332 and 334 and the shared source degeneration inductors 236 and 238 are used by both the first and second LNAs. Consequently, the circuit 300 can require 50% less available space and power for the source degeneration inductors and the load inductors of the first and second LNAs than the circuit 100 of FIG. 1. The LNAs can be differential or single ended.

Figure 4:
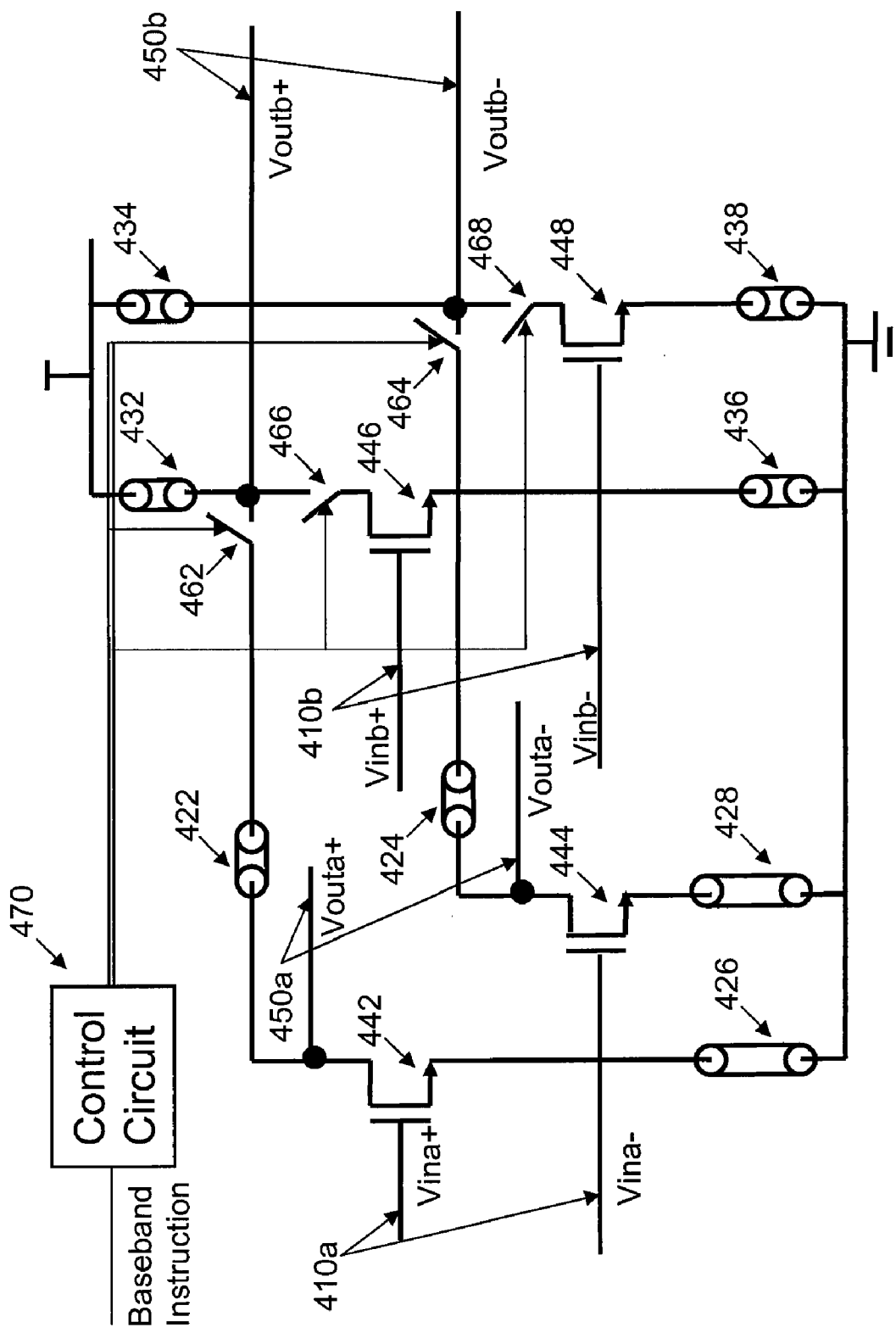
FIG. 4 is a schematic of an example of a circuit employing switched load inductor sharing.

FIG. 4 is an example schematic of a circuit 400 employing switched load inductor sharing within, for example, multi-band communication systems. The switched load inductor sharing method is especially useful for bands with a difference of center frequencies $f_{cdiff}$ exceeding a limiting bandwidth $f_{lbw}$. The circuit 400 has switches 462-468 for sharing the shared load inductors 432 and 434, dedicated load inductors 422 and 424 and dedicated source degeneration inductors 426, 428, 436, and 438. The circuit 400 can be used to enable sharing of the load inductors 432 and 434 with LNAs directed to both higher and lower frequency bands by switching switches 462-468 with a control circuit 470.

The values of the load and the source degeneration inductors required can be inversely proportional to the frequency squared. Therefore the lower frequency band may use larger inductors. The circuit 400 includes two inputs 410a and 410b, inductors 422-438, transistors 442-448, and outputs 450a and 450b. The two inputs 410a can follow the antenna or one or more RF filters, such as a SAW band select filter. The two outputs 450a and 450b have output amplified signals of multiple different bands and can be connected to one or more following mixers.

Transistors 442 and 444 represent a first LNA which uses varying inductors and switches. In particular, the transistors 442 and 444 use the dedicated load inductors 422 and 424, two of the dedicated source degeneration inductors, 426 and 428, and selectively use the shared load inductors 432 and 434. Transistors 446 and 448 represent a second LNA which uses a second set of inductors. The second set of inductors includes the other two of the dedicated source degeneration inductors, 436 and 438 and the shared load inductors 432 and 434.

When the two of the switches 462 and 464 are switched to a first state of a closed position, the shared load inductors 432 and 434 are connected to the dedicated load inductors 422 and 424, respectively to provide the load inductors (e.g., inductors 422, 424, 432, and 434) for the first LNA of a lower frequency when the first LNA becomes active. The second LNA, which may be directed to a higher frequency, can be shut off when the first LNA is activated by switching the other two of the switches 466 and 468 to the second state of the open position, thus disconnecting the shared load inductors 432 and 434 from the transistors 446 and 448, respectively.

When the two of the switches 462 and 464 are switched to a second state of an open position, the first LNA for a lower frequency band is shut off. When the first LNA is deactivated, the second LNA can be made active by switching the other two of the switches 466 and 468 to the first closed state, thereby connecting the shared load inductors 432 and 434 to the transistors 446 and 448. The switches 462 and 464 are controlled through a signal from the control circuit 470.

A non-active LNA can be shut-off using various methods, such as, switching an input of the LNA to ground, disconnecting the load inductors, or disconnecting the power supply. These are merely example of methods for shutting off an LNA. FIG. 4 shows the first and the second LNAs being shut off by switching the switches 462-468 to the second state of the open position by the control circuit 470 to disconnect the two LNAs from the load inductors. In addition the switches 462-468 can have the additional function of connecting to the shared load inductors 432 and 434 to provide the proper load inductors to the first or the second LNA as well as shutting off the first LNA or the second LNA by disconnecting the power supply. One implementation can place the switches 466 and 468 between the inputs of the second LNA and ground such that the switches 466 and 468 can shut off the second LNA.

Further, switched load inductor sharing can employ switching parallel load inductors to decrease the value of a shared inductor for a higher frequency band LNA. This implementation can increase the power and size compared to the switched serial inductors as described above. Similar to the implementation of FIG. 4, switched source degeneration inductor sharing can also be employed in multi-band communication systems as shown in FIG. 5.

Figure 5:
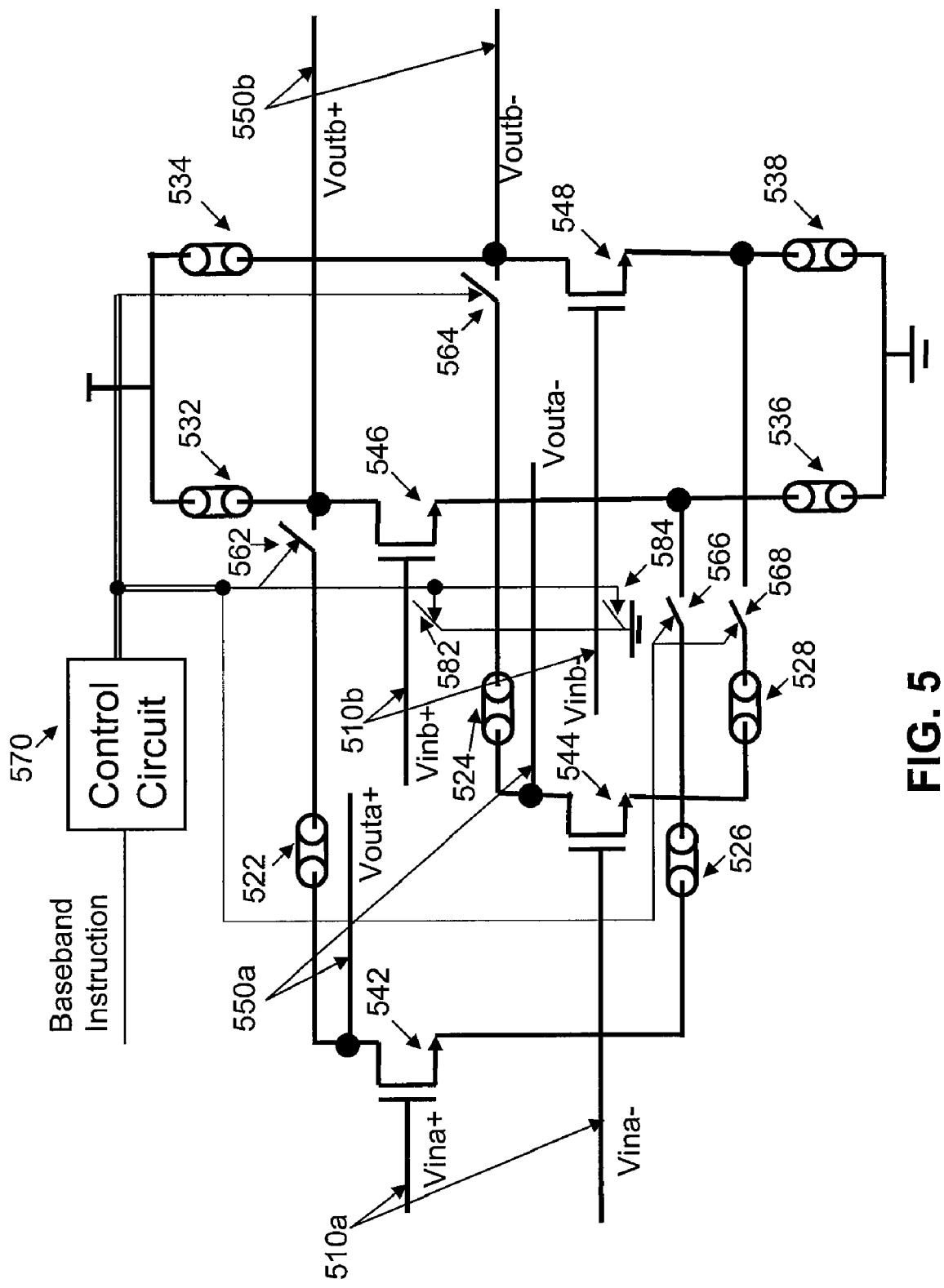
FIG. 5 is a schematic of an example of a circuit employing switched source degeneration inductor sharing and switched load inductor sharing.

FIG. 5 is an example schematic of a circuit 500 employing switched source degeneration and switched load inductor sharing. The circuit 500 is similar to the circuit 400 discussed with respect to FIG. 4 with the use of additional switches. The circuit 500 can be used to enable sharing of source degeneration inductors 536 and 538 and load inductors 532 and 534 for two frequency bands particularly when the difference of their center frequencies exceeds a limiting frequency bandwidth $f_{lbw}$. The circuit 500 includes two inputs 510a and 510b, inductors 522-538, transistors 542-548, a control circuit 570 and two outputs 550a and 550b. The two inputs 510a and 510b can follow the antenna or one or more RF filters, such as a SAW band select filter. The outputs 550a and 550b have output amplified signals of multiple different bands and can be connected to one or more following mixers.

Transistors 542 and 544 represent a first LNA which uses varying inductors. In particular, the transistors 542 and 544 use dedicated load inductors 522 and 524, dedicated source degeneration inductors 526 and 528, and selectively use shared source degeneration inductors 536 and 538 and shared load inductors 532 and 534. Transistors 546 and 548 represent a second LNA which uses a second set of inductors. The second set of inductors includes the shared source degeneration inductors 536 and 538 and the shared load inductor 532 and 534.

When switches 562-568 are switched to a first state of a closed position, the first LNA is the receiving amplifier. When the switches 562-568 are switched to a second state of an open position, the second LNA is the receiving amplifier. When the first LNA is activated to be the receiving amplifier, switches 582 and 584 can be switched to a first state of the closed position to connect the second input 510b to ground to shut off the second LNA. When the second LNA is activated to be the receiving amplifier, the switches 582 and 584 are switched to a second state of the open position. The switches 562-568, 582, and 584 are controlled through control signals generated by the control circuit 570. Some implementations can employ switched parallel load and source degeneration inductors.

Figure 6:
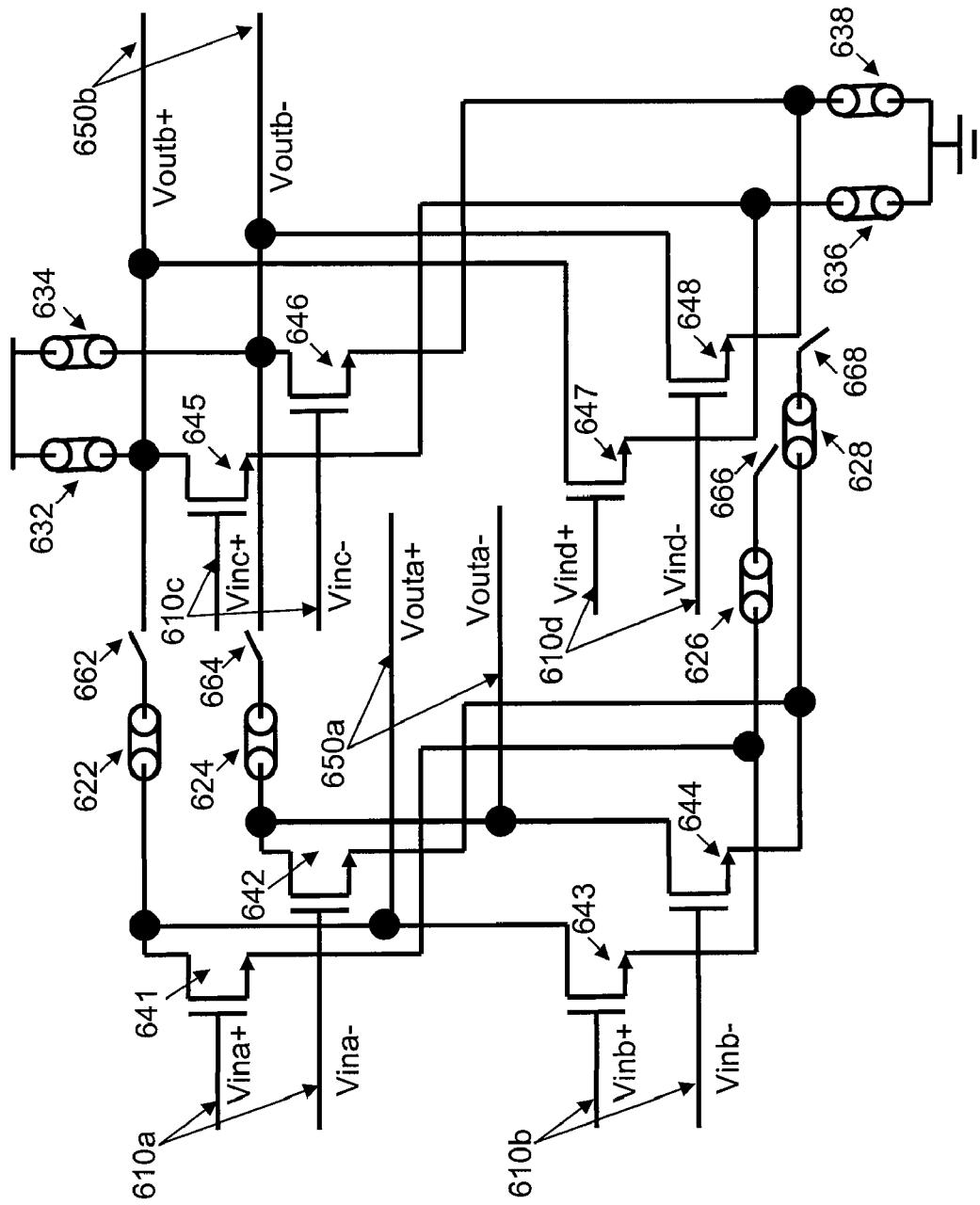
FIG. 6 is a schematic of an example of a circuit employing switched source degeneration inductor sharing and switched load inductor sharing in a quad-band communication system.

FIG. 6 is an example schematic of a circuit 600 employing both switched and direct load inductor and source degeneration inductor sharing in a quad-band communication system. The circuit 600 employs four LNAs to process signals from each of the four bands. In various implementations, the circuit 600 can be used to enable sharing of source degeneration inductors 636 and 638 and load inductors 632 and 634 for two pairs of frequency bands. In particular, each pair exhibits a center frequency difference approximately within each respective limiting bandwidth but bigger center frequency difference between the two pairs than a limiting bandwidth of the two pairs. Further, the circuit 600 includes four inputs 610a-610d, inductors 622-638, transistors 641-648, and two outputs 650a and 650b. The four inputs 610a-610d can each follow the antenna or separate band select RF filters. The outputs 650a and 650b output amplified signals of each of the four bands and can be connected to one or more following mixers.

Transistors 641 and 642 represent a first LNA dedicated to a first band of the quad-band signal which uses varying inductors and a first set of switches. In particular, the transistors 641 and 642 use load inductors 622 and 624, source degeneration inductors 626 and 628, shared load inductors 632 and 634 through switches 662 and 664, and shared source degeneration inductors 636 and 638 through switches 666 and 668.

Similarly, transistors 643 and 644 represent a second LNA dedicated to a second band of the quad-band signal which uses varying inductors. The transistors 643 and 644 use the load inductors 622 and 624 and the source degeneration inductors 626 and 628 (which are shared with only the first LNA) and also use the shared load inductors 632 and 634 through the switches 662 and 664 and the shared source degeneration inductors 636 and 638 (which are shared with each of the LNAs) through the switches 666 and 668. In one implementation, the first and the second LNAs share the same load and source degeneration inductors for two frequency bands with the difference of their center frequencies within a first limiting frequency bandwidth.

Transistors 645 and 646 represent a third LNA dedicated to a third band of the quad-band signal which uses the shared source degeneration inductors 636 and 638 and the shared load inductors 632 and 634. Transistors 647 and 648 represent a fourth LNA dedicated to a fourth band of the quad-band signal which uses the shared source degeneration inductors 636 and 638 and the shared load inductors 632 and 634. The third and fourth frequency bands can have higher frequencies than those of the first and the second frequency bands such that the center frequency difference between the third/fourth frequency bands and the first/second frequency bands is greater than the limiting frequency bandwidth between the third/fourth frequency bands and the first/second frequency bands. The difference of the center frequencies between the third and fourth bands is within a limiting frequency bandwidth for the third and fourth frequency bands.

When the switches 662-668 are switched to a first state of a closed position, the receiving LNA can be the first LNA or the second LNA. When the switches 662-668 are switched to a second state of an open position, the receiving LNA can be the third LNA or the fourth LNA. The switches 662-668 can be controlled through a signal generated by a digital control circuit. For simplicity, such a control circuit is not shown in the circuit 600 of FIG. 6.

Therefore, the shared load inductors 632 and 634 can be used by each of the four LNAs selected by the switches 662 and 664. The switches 666 and 668 can be used in sharing the shared source degeneration inductors 636 and 638 with the four LNAs to further reduce the size of total inductors for power, size and cost savings. The first and the second LNAs share the same sets of load and source degeneration inductors when the switches 662-668 are switched to a first state of a closed position. The third and the fourth LNAs also share the same sets of load and source degeneration inductors when the switches 662-668 are switched to a second state of an open position.

In various implementations, at most one of the LNAs can be activated for receiving the input signals. A non-active LNA can be shut-off using various methods, such as, switching an input of the LNA to ground, disconnecting the load inductors, or disconnecting the power supply. When the switches 662-668 are switched to the second state of open positions, the first and the second LNAs are disconnected from the power supply thus are shut off. For the third and the fourth LNAs, shut off methods, such as those described previously (not shown in FIG. 6) can be implemented.

Another implementation of the quad-band system includes additional switches and switched load and source degeneration inductors for each of the LNAs to switch in each respective load and source inductor. This switched inductor sharing implementation can increase the size and power compared to the implementation of FIG. 6 but can afford greater flexibility in the selective sharing of inductors. Such a system may be preferable in providing an ability to share load inductors for indeterminate frequency bands. For example, the schematic 500 of FIG. 5 can be altered to include four LNAs such that each LNA includes its own dedicated inductors, such as dedicated inductors 522-528, and switched shared inductors 532-538.

Also, various implementations can use fewer switches in sharing load and source degeneration inductors. For example, one implementation uses four frequency bands with two pairs of close frequency bands by sharing both load and source inductors but switching only the source inductors. This implementation is useful for situations utilizing the schematic of FIG. 6 using high performance LNAs.

Figure 7A:
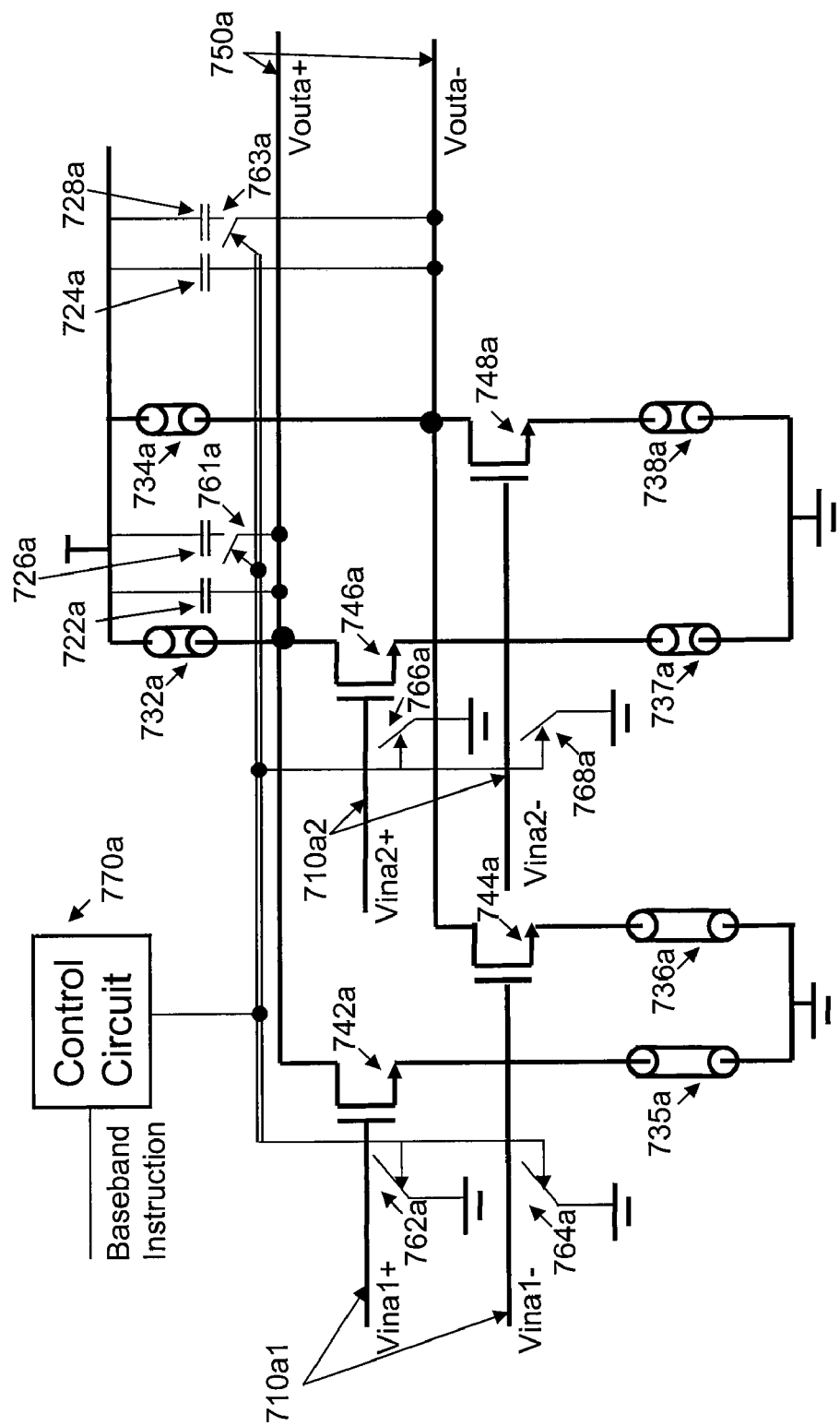
FIG. 7A and FIG. 7B are schematics of examples of circuits employing load inductor sharing with switched load capacitors.
Figure 7B:
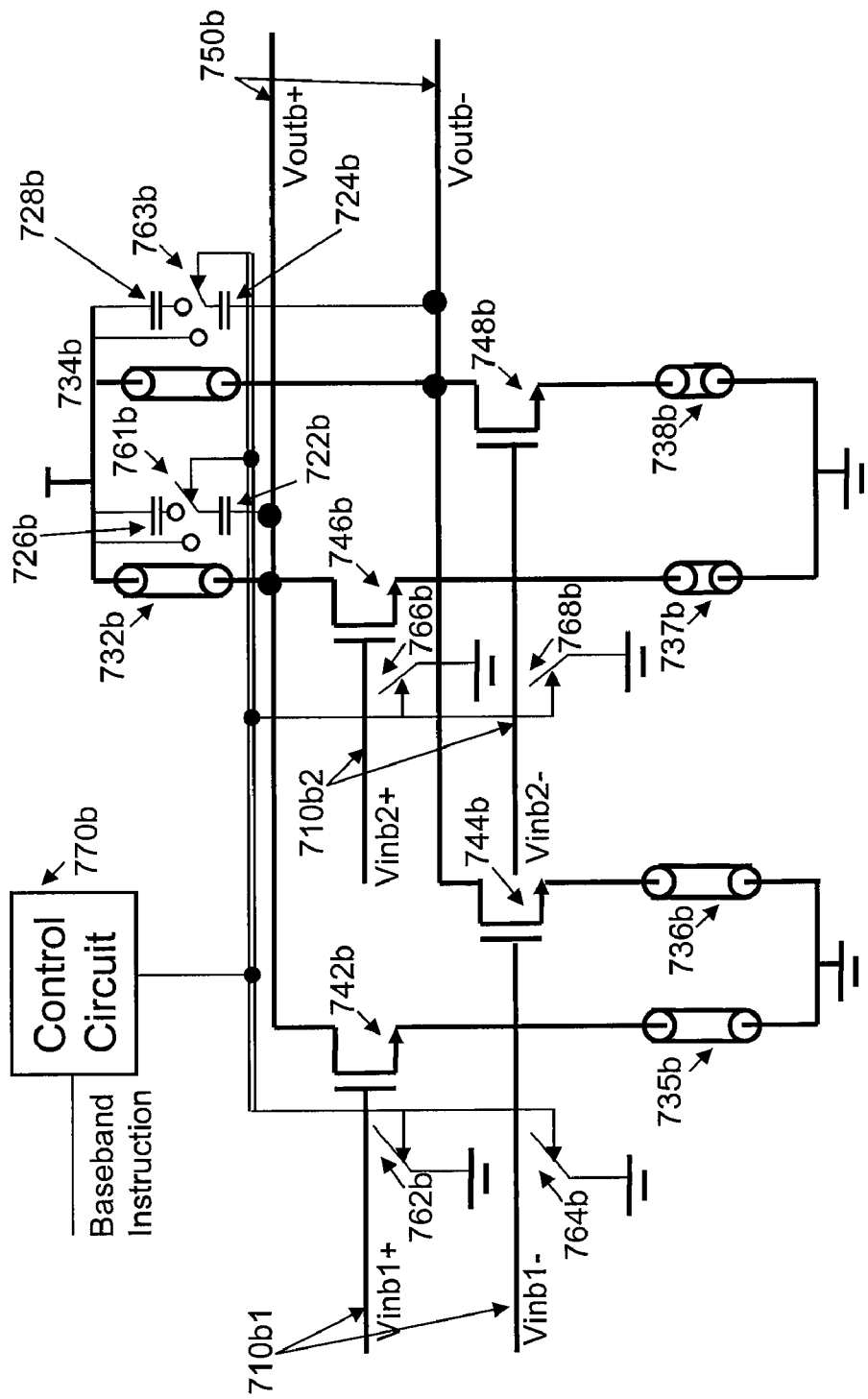

FIGS. 7A and 7B are example schematics of circuits employing load inductor sharing with switched load capacitors. In particular, FIGS. 7A and 7B increase and decrease total load capacitance by switching load capacitors in parallel or in series with fixed load capacitors of LNAs in, for example, multi-band communication systems. The frequency of a signal can be inversely proportional to the square root of the product of the load capacitance and the load inductance. Therefore, LNAs for different frequency bands can share the same load inductors though changing the total load capacitances of the LNAs by switching load capacitors to increase or decrease the total load capacitance of an LNA.

FIG. 7A is an example schematic of a circuit 700A employing load inductor sharing with switched load capacitors. The circuit 700A can be especially useful for bands with a difference of center frequencies $f_{cdiff}$ exceeding a limiting bandwidth $f_{lbw}$. The circuit 700A has added switched load capacitors 726a and 728a in parallel to fixed load capacitors 722a and 724a, respectively. The circuit 700A also includes shared load inductors 732a and 734a and dedicated source degeneration inductors 735a-738a.

The circuit 700A can be used to enable sharing of the shared load inductors 732a and 734a of the higher frequency band by switching switches 761a and 763a to a first state of a closed position to connect the switched load capacitors 726a-728a in parallel to the fixed load capacitors 722a and 724a for using the lower frequency band. The center frequency of a band can be inversely proportional to the square root of the product of an inductance and a capacitance of an equivalent parallel tank circuit. Therefore, the capacitors can be switched while keeping the shared load inductors the same for both bands instead of switching the inductors as described above, for example, with respect to FIG. 4.

The value of the total load capacitance can be inversely proportional to the square of the frequency. The lower frequency band can use larger capacitors. The circuit 700A includes two inputs 710a1 and 710a2, transistors 742a-748a, and one output 750a. The two inputs 710a1 and 710a2 can follow the antenna or one or more RF filters, such as a SAW band select filter. The output 750a has output amplified signals of multiple different bands and can be connected to one or more following mixers.

Transistors 742a and 744a represent a first LNA which uses shared inductors, varying capacitors and switches. In particular, the transistors 742a and 744a use the shared load inductors 732a and 734a, two of the dedicated source degeneration inductors 735a and 736a, the fixed load capacitors 722a and 724a and selectively use the switched load capacitors 726a and 728a. Transistors 746a and 748a represent a second LNA which uses the fixed load capacitors 722a and 724a, the shared load inductors 732a and 734a, and the other two of the dedicated source degeneration inductors 737a and 738a. When the switches 761a and 763a are switched to a first state of a closed position, the switched load capacitors 726a and 728a are added to the fixed load capacitors 722a and 724a, respectively, to increase the total load capacitance of the LNA for a lower frequency band. Switches 762a, 764a, 766a, and 768a are employed to activate or deactivate the LNAs as described previously. The switches 761a-768a are controlled by a control circuit 770a.

FIG. 7B is another example schematic of circuits employing load inductor sharing with switched load capacitors. The circuit 700B shown in FIG. 7B is particularly useful for bands with a difference of center frequencies $f_{cdiff}$ exceeding a limiting bandwidth $f_{lbw}$. The circuit 700B is similar to the circuit 700A shown in FIG. 7A except the switched load capacitors 726b and 728b are switched in series to the fixed load capacitors 722b and 724b. The shared load inductors 732b and 734b and the fixed load capacitors 722b and 724b are used by the first LNA for a lower frequency band when switches 761b and 763b are switched to a third state of a position of a power supply to bypass the fixed load capacitors 722b and 724b. When the switches 761b and 763b are switched to a first state of the closed position, the fixed load capacitors 722b and 724b are added in series with the switched load capacitors 726b and 728b, respectively, to decrease the total load capacitance used with a second LNA for a higher frequency band.

Switches 762b, 764b, 766b, and 768b are used here to shut off the non-active first or second LNA by grounding the inputs 710b1 and 710b2 of the first and the second LNA, respectively. One implementation places the switches 761b and 763b at the power supply to connect or bypass the switched load capacitors 726b and 728b by connecting or disconnecting the power supply to the center connection of the fixed load capacitors 722b and 724b and the switched load capacitors 726b and 728b. Another implementation reverses the positions of the fixed load capacitors 722b and 724b with the switched load capacitors 726b and 728b and places the switches 761b and 763b at the output 750b of the LNAs to bypass the switched load capacitors 726b and 728b by shorting the two terminals of the switched load capacitors 726b and 728b, respectively.

Similar to sharing load inductors by switching the load capacitors, the product of the gate-source capacitance and the source degeneration inductance can be inversely proportional to the square of the frequency of a signal for an LNA. Therefore, LNAs for different frequency bands can share the source degeneration inductors through increasing or decreasing the source-gate capacitances of an LNA.

Figure 8A:
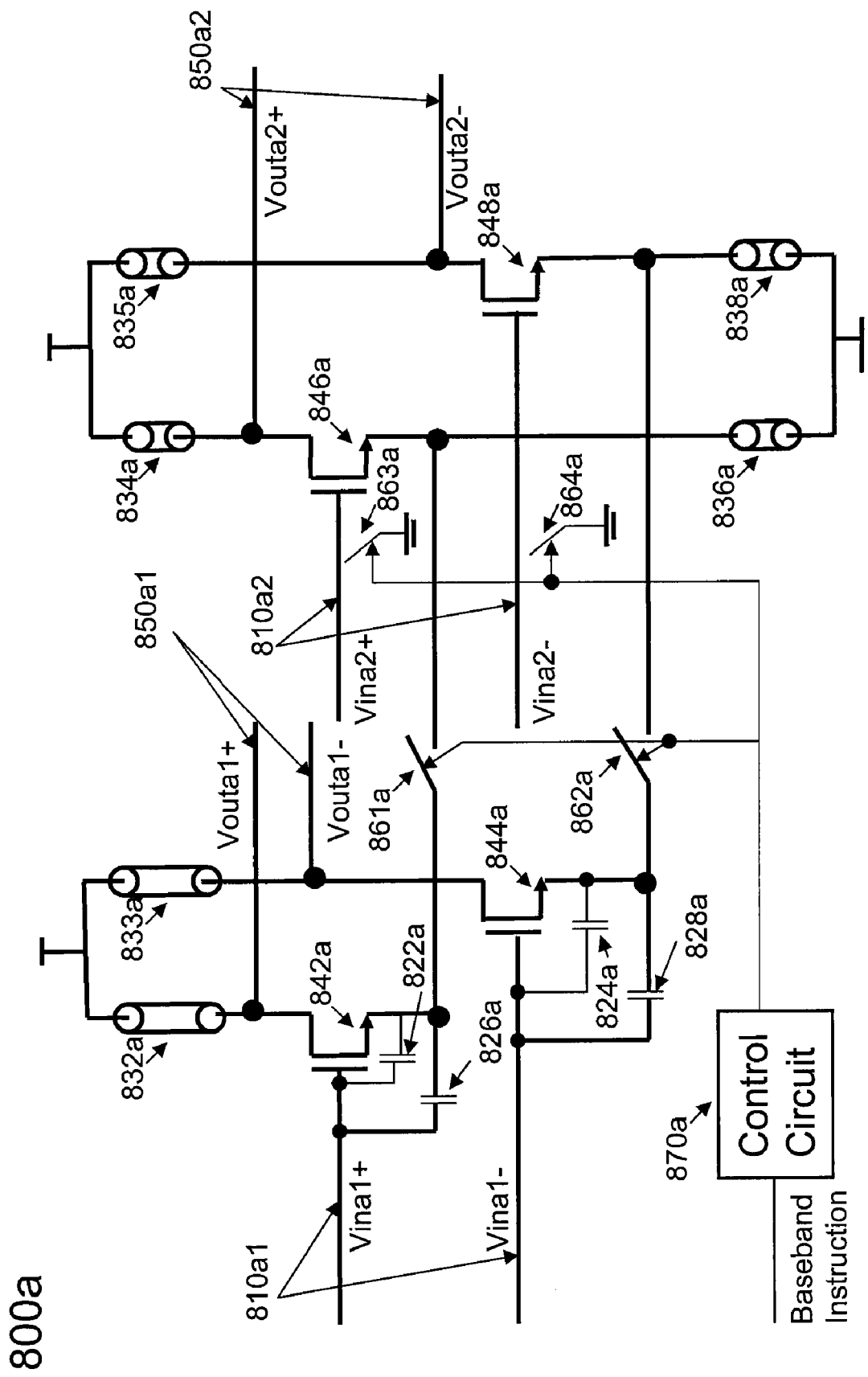
FIG. 8A and FIG. 8B are schematics of examples of circuits employing source degeneration inductor sharing with switched gate-source capacitors.
Figure 8B:
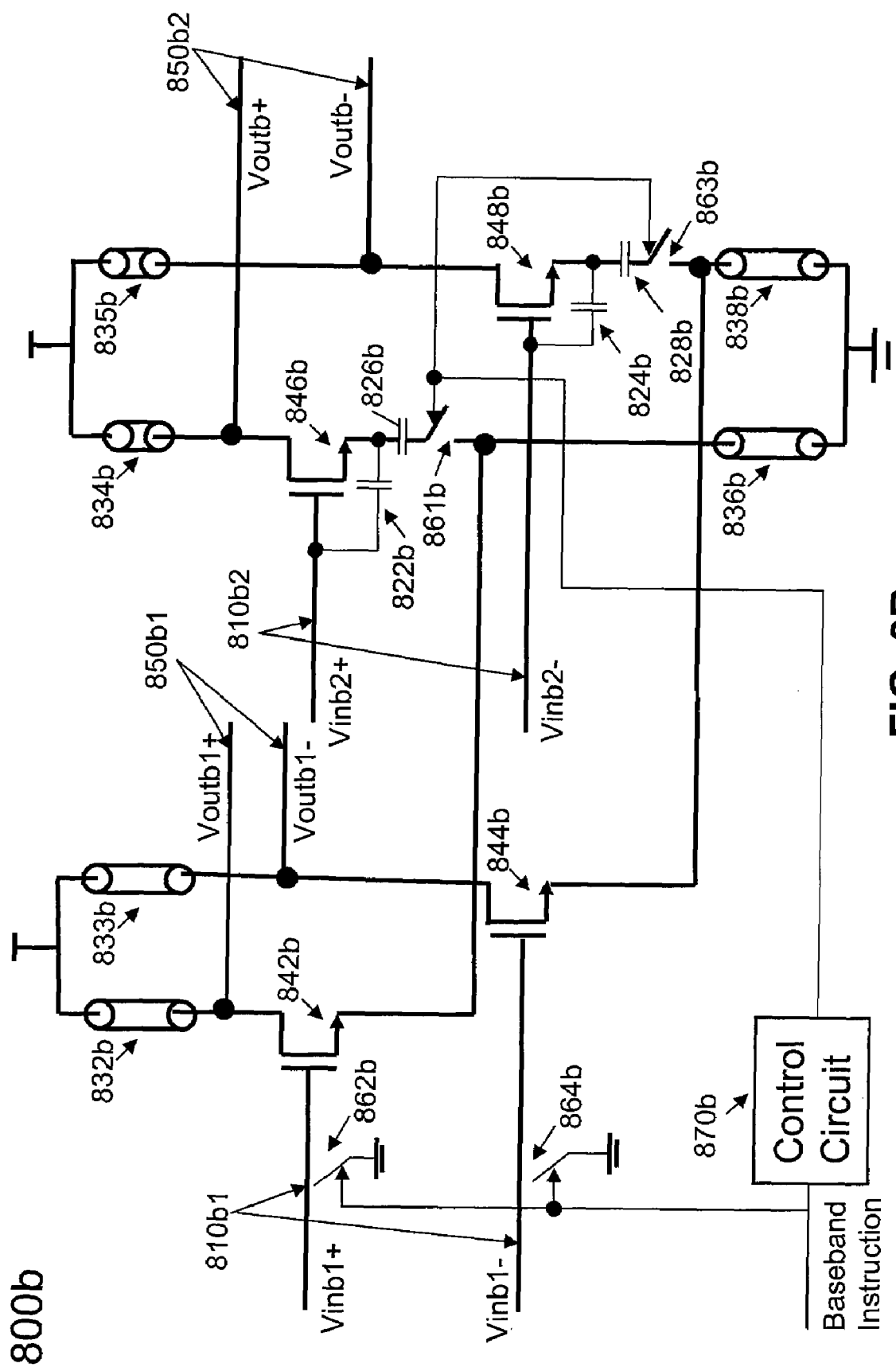

FIGS. 8A and 8B are example schematics of circuits employing source degeneration inductor sharing with switched gate-source capacitors. In particular, FIGS. 8A and 8B increase or decrease gate-source capacitance of LNAs to enable source degeneration inductor sharing in, for example, multi-band communication systems. The techniques of increasing or decreasing gate-source capacitance to enable source degeneration inductor sharing for LNAs in multi-band communication systems are particularly useful when the difference of the center frequencies $f_{cdiff}$ becomes bigger than a limiting bandwidth $f_{lbw}$.

In some implementations, the lower frequency band can share the source degeneration inductor for a higher frequency band by switching in a larger gate-source capacitance to increase the gate-source capacitance of the lower frequency LNA. In other implementations, the shared source degeneration inductor is for a lower frequency band and the gate-source capacitance of the higher frequency band can be decreased for the LNA of a higher frequency band. The switched in gate-source capacitor can be added or be designed with transistors of smaller gate-source capacitance for the LNA of the higher frequency band.

FIG. 8A is an example schematic of a circuit 800A employing source degeneration inductor sharing with switched gate-source capacitors and increased gate-source capacitance. The circuit 800A includes supplemental gate-source capacitors 826a and 828a in parallel to the transistor gate-source capacitors 822a and 824a, respectively, shared source degeneration inductors 836a and 838a, dedicated load inductors 832a-835a, inputs 810a1 and 810a2, outputs 850a1 and 850a2, switches 861a-864a, and transistors 842a-848a. In some implementations, the transistor gate-source capacitors 822a and 824a represent total capacitances internal to and capacitors (e.g., parasitic capacitors) fabricated along with the transistors 842a and 844a when not employing shared source degeneration inductors with switched gate-source capacitors (e.g., for the LNAs shown in FIGS. 1-7). The supplemental gate-source capacitors may represent additional capacitors internal to and/or external to the transistors 842a and 848a (e.g., the transistors 842a and 848a can have larger transistor gate-source capacitances compared to those used for the LNAs of FIGS. 1-7).

Transistors 842a and 844a represent the first LNA. In particular, the transistors 842a and 844a use two of the dedicated load inductors 832a-833a, the shared source degeneration inductors 836a and 838a, and the transistor gate-source capacitors 822a and 824a in parallel with the supplemental gate-source capacitors 826a and 828a, respectively, to increase the total gate-source capacitance using two of the switches 861a and 862a. The gate-source capacitance can be increased by using the supplemental gate-source capacitors 826a and 828a or by designing transistors 842a and 844a with higher gate-source capacitance as included within the transistor gate-source capacitors 822a and 824a. Transistors 846a and 848a represent a second LNA which uses the other two dedicated load inductors 834a and 835a and the shared source degeneration inductors 836a and 838a.

The circuit 800A can be used to enable sharing of the source degeneration inductors 836a and 838a of a higher frequency band LNA by adding the supplemental gate-source capacitors 826a and 828a to the transistor gate-source capacitors 822a and 824a to increase the gate-source capacitance of the lower frequency band LNA. In particular, when two of the switches 861a and 862a are switched to a first state of a closed position and the other two of the switches 863a and 864a are switched to a second state of an open position, the first LNA is the receiving amplifier and the second LNA is shut off. The first LNA has a total gate-source capacitance as a sum of the transistor gate-source capacitors 822a and 824a and the supplemental gate-source capacitors 826a and 828a, respectively, and is coupled to the shared source degeneration inductors 836a and 838a. When the two of the switches 861a and 862a are switched to a second state of an open position and the other two of the switches 863a and 864a are switched to a first state of a closed position, the second LNA is the receiving amplifier and the first LNA is disconnected from the source degeneration inductors 836a and 838a.

The switches 861a-864a are controlled by a control circuit 870a. Some implementations can place the two of the switches 861a and 862a between the sources of the transistors 842a and 844a and the supplemental gate-source capacitors 826a and 828a, respectively and can use grounding inputs to deactivate the first LNA as described previously.

FIG. 8B is an example schematic of a circuit 800B employing source degeneration inductor sharing with decreased gate-source capacitance. The circuit 800B shown in FIG. 8B is similar to the circuit 800A shown in FIG. 8A except the transistor gate-source capacitors 822b and 824b are in series with the supplemental gate-source capacitors 826b and 828b to decrease the total gate-source capacitance. The shared source degeneration inductors 836b and 838b are the source degeneration inductors for the first LNA of the lower frequency band.

The gate-source capacitance can be decreased by adding the supplemental gate-source capacitors 826b and 828b to the transistor gate-source capacitors 822b and 824b in series, respectively, between the source of the transistors 846b and 848b and the shared source degeneration inductors 836b and 838b or by designing the transistors 846b and 848b with a lower value gate-source capacitance for the transistor gate-source capacitors 822b and 824b for the second LNA of a higher frequency band. The switches 861b-864b are also used to shut off the LNAs by grounding the inputs of the first LNA or by disconnecting the second LNA from the shared source degeneration inductors 836b and 838b. The switches 861a-864a are controlled by a control circuit 870b.

FIGS. 9-12 are schematics demonstrating four examples of multi-band receivers in which the varying inductor sharing techniques described above can be used in combination. In some cases, the description below may avoid repetition by generally describing situations where the above techniques are used without repeating details described above of how some techniques may be implemented.

Figure 9:
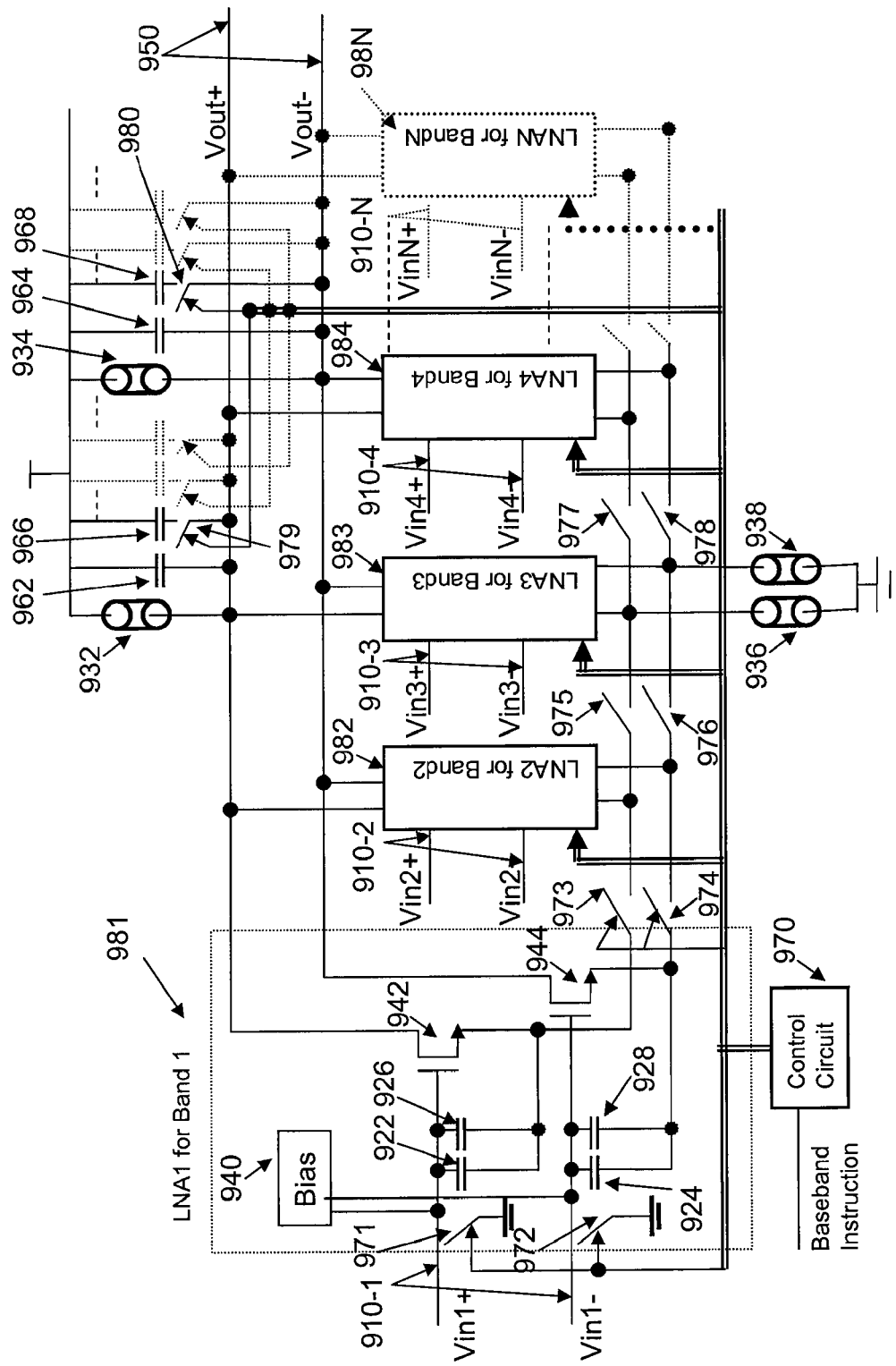
FIG. 9 is a schematic of an example of a circuit employing source degeneration inductor sharing and load inductor sharing with switched gate-source capacitors and switched load capacitors for a multi-band communication system.

FIG. 9 is an example schematic of a circuit 900 enabling source degeneration and load inductor sharing with switched load and switched gate-source capacitors. The circuit 900 can be particularly useful for example, in multi-band communication systems employing two or more LNAs to process signals from each of the two or more bands with difference of center frequencies more than a respective limiting bandwidth. Also, the circuit 900 can be used in systems using two or more sets of frequency bands with the frequency bands within a given set having the difference of the center frequencies $f_{cdiff}$ approximately within a limiting bandwidth $f_{lbw}$, but where the center frequency differences between the sets are bigger than their respective limiting bandwidth $f_{lbw}$. The circuit 900 can implement sharing of shared source degeneration inductors 936 and 938 and shared load inductors 932 and 934 by switching in additional load and gate-source capacitors.

The circuit 900 includes LNAs 981-98N for N frequency bands. Each LNA1-LNAN can be configured similarly to LNA1 981 to employ load and source degeneration inductor sharing using switched capacitors. Furthermore, the circuit 900 includes N inputs 911 to 91N, shared load and source degeneration inductors 932-938, fixed capacitors, for example, fixed capacitors 922-928, 962 and 964 used for LNA1 981, various number of supplemental capacitors, for example, supplemental capacitors 926, 928, 966 and 968 used for LNA1, one output 950 and a control circuit 970. Generally, N is equal to or less than the total number of bands used by a system or an integrated circuit device.

The process of sharing source degeneration inductors may be similar as the process described above (e.g., FIG. 8A/B). For the purpose of illustration, the employment of load and source degeneration inductors 936, 938 and switches 979 and 980 shared by adjustment of the load and transistor gate-source capacitors is described for the LNA1 981. For instance, LNA1 981 can connect to the shared source degeneration inductors 936 and 938 by switching switches 973-976 to a closed position and switches 977 and 978 to an open position while LNA2-LNAN are deactivated using techniques described above. In addition, LNA1 981 can connect to the supplemental capacitors 966 and 968 by switching switches 979 and 980 to the closed position to use the shared load inductors 932 and 934 while deactivating LNA2-LNAN 982-98N. In some implementations, cascaded switches 973-976 are used for the connection to the shared source degeneration inductors 936 and 938 as described above. In other implementations, the switches can be connected directly to the source inductors 936 and 938 by separate connections (not shown) without going through the switches 975 and 976, which in this case, the switches 975 and 976 can be switched to the open position to deactivate LNA2 982.

The techniques described in FIG. 8B can be used for the LNAs dedicated to higher frequencies than LNA3 by employing supplemental serial load and gate-source capacitors to decrease the total load and gate-source capacitances for higher frequency bands as shown in FIG. 8B.

When using a switch to add a capacitor, there is added resistance to the system from both the switch as well as the capacitor. The added resistance can increase noise in the system. Employing switched capacitors instead of switched inductors can reduce noise and enhance performance due to the inductive characteristics of inductors.

In some implementations, some of the LNAs LNA1-LNAN are used with multiple bands (according to sharing techniques described above). Therefore, N can be smaller than the total number of frequency bands used by the system.

The circuit 900 can be used, for example, in a quad-band communication system employing four LNAs and switching both load and gate-source capacitors to enable inductor sharing from two lower (band 1 and band 2) and two higher frequency (band 3 and band 4) bands. In this example, there are four rather than the "N" number of elements for the inputs and LNAs used for four frequency bands. In particular, the circuit 900 includes four inputs 911 to 914, shared load and source degeneration inductors 932-938, capacitors 922-928 and 962-968, LNA1-LNA4 981-984, one output 950 and a control circuit 970. The four inputs 911 to 914 can each follow the antenna or separate band select RF filters. The output 950 outputs amplified signals of one of the four bands and can be connected to one or more following mixers.

The LNA1 981 for band 1, a lowest frequency band, can use transistors 942 and 944, an input 911, fixed capacitors 922-928, shared capacitors 962-968, a bias circuit 940 to supply a reference voltage, shared load and source degeneration inductors 932-938, an input 910a and the output 950. When the switches 973-980 are switched to a first state of a closed position, the capacitors 926 and 928 and 966 and 968 are added in parallel to the fixed capacitors 922 and 924, and 962 and 964 respectively to increase the total gate-source and load capacitances to a value for LNA1 981 to use with the shared load and source degeneration inductors 932-938. The switches 971 and 972 are switched to a second state of an open position to activate the LNA1 981. The LNA1 981 can be shut off with the switches 971 and 972 switched to a second state of a closed position to ground the input 911.

LNA2 982 can use similar elements as LNA1 981 and can be dedicated to frequency band 2. The difference of the center frequencies of band 1 and band 2 can be within a first limiting bandwidth $f_{lbw1}$. Also, LNA2 982 can use similar components to those of LNA1 981. The input 912 can be switched to ground (switches not shown) to shut off the LNA2 982.

LNA3 983 and LNA4 984 can be dedicated to band 3 and band 4, respectively, and the difference of the center frequencies of band 3 and band 4 can be within a second limiting bandwidth $f_{lbw2}$. Band 3 and band 4 can be the higher frequency bands. Also, the center frequencies of the band 1 and band 2 can be far enough apart from the center frequencies of the band 3 and band 4 to exceed a third limiting bandwidth $f_{lbw3}$. LNA3 983 or LNA 4 984 can each use components similar to those shown for LNA1 981 but without the added fixed capacitors 922-928. The inputs 913 and 914 can be switched to ground (switches not shown) to shut off the LNA3 983 and LNA4 984, respectively.

When the center frequencies of all four bands are far enough apart to exceed the bandwidth of $f_{lbw}$, additional switched load capacitors and switched gate-source capacitors (adding gate-capacitors or designing the LNA transistors with larger capacitances) for LNA1-LNA3 981-983 can be employed to enable the sharing of the shared load and source degeneration inductors 932-938. The inductor sharing with switched capacitor techniques shown in FIG. 9 can be extended to include M number of LNAs for communication systems of N-bands, whereas M is less than or equal to N, by adding switched load capacitors.

Figure 10:
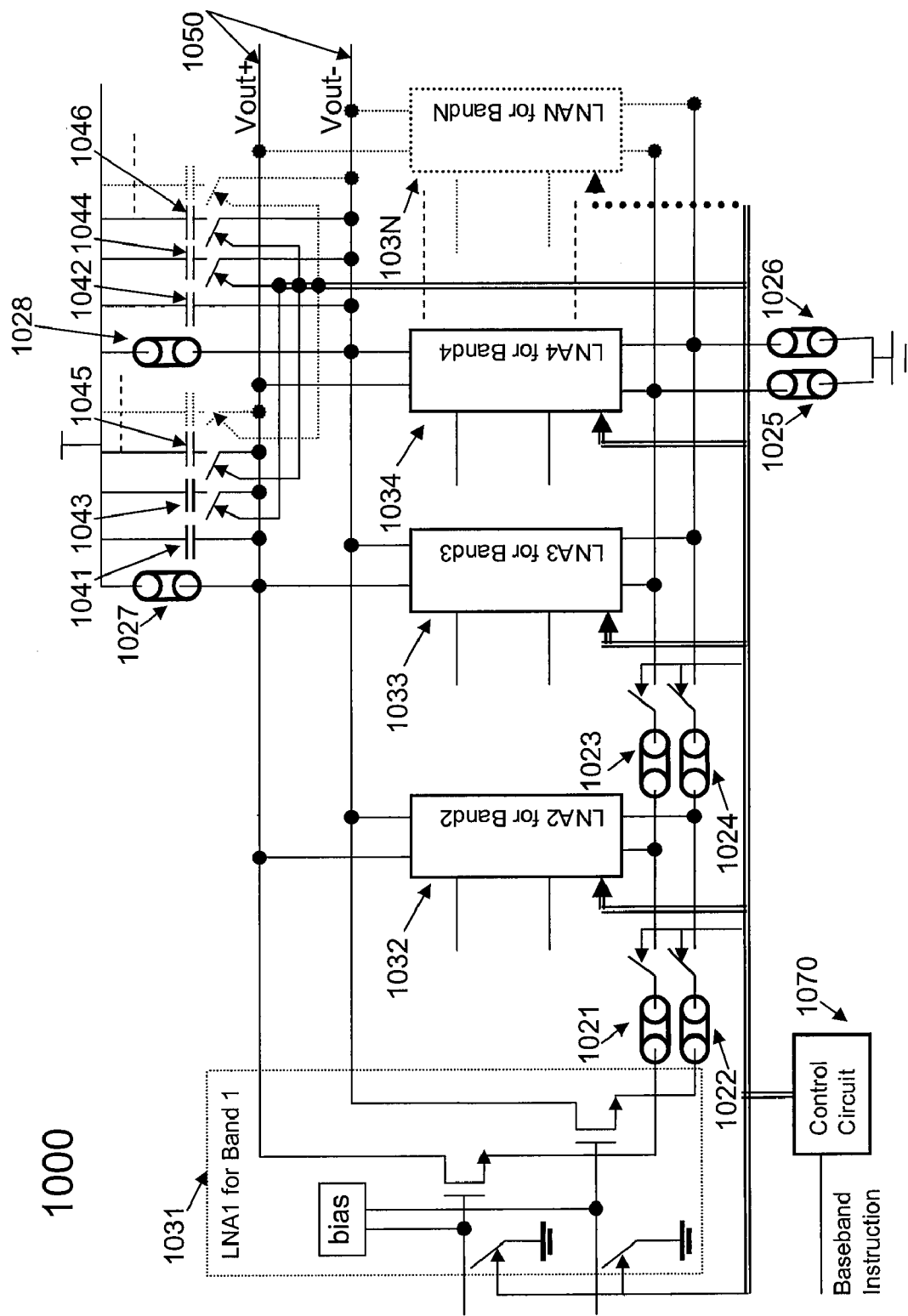
FIG. 10 is a schematic of an example of a circuit employing switched source degeneration inductor sharing and load inductor sharing with switched load capacitors for a multi-band communication system.

FIG. 10 is an example schematic of a circuit employing switched source degeneration inductor sharing and load inductor sharing with switched load capacitors. Circuit 1000 can be used, for example, in a quad-band communication system with band 3 and band 4 having close bands with a difference of center frequencies within a limiting bandwidth to form a close band pair, while band 1, band 2, and the close band pair have center frequencies far enough apart to exceed their respective limiting bandwidths. The circuit 1000 includes LNA1-LNAN 1031-103N, a control circuit 1070 for controlling the switches, and a single output 1050.

The close band pair LNA3 1033 and LNA4 1034 both use shared load inductors 1027 and 1028, shared source degeneration inductors 1025 and 1026, and the fixed load capacitors 1041 and 1042. LNA1 1031 uses the shared load inductors 1027 and 1028, the shared source degeneration inductors 1025 and 1026, dedicated switched source degeneration inductors 1021-1024, switched load capacitors 1043-1046, and the fixed load capacitors 1041 and 1042, through use of various switches (not labeled). LNA2 1032 uses the shared load inductors 1027 and 1028, the shared source degeneration inductors 1025 and 1026, two of the dedicated switched source degeneration inductors 1023 and 1024, two of the switched load capacitors 1045 and 1046, and the fixed load capacitors 1041 and 1042, through use of various switches (not labeled). Circuit 1000 can be extended to be used for M LNAs to enable load and source degeneration inductor sharing with switched and fixed load capacitors, where M is equal or less than N with an N-band communication system.

Figure 11:
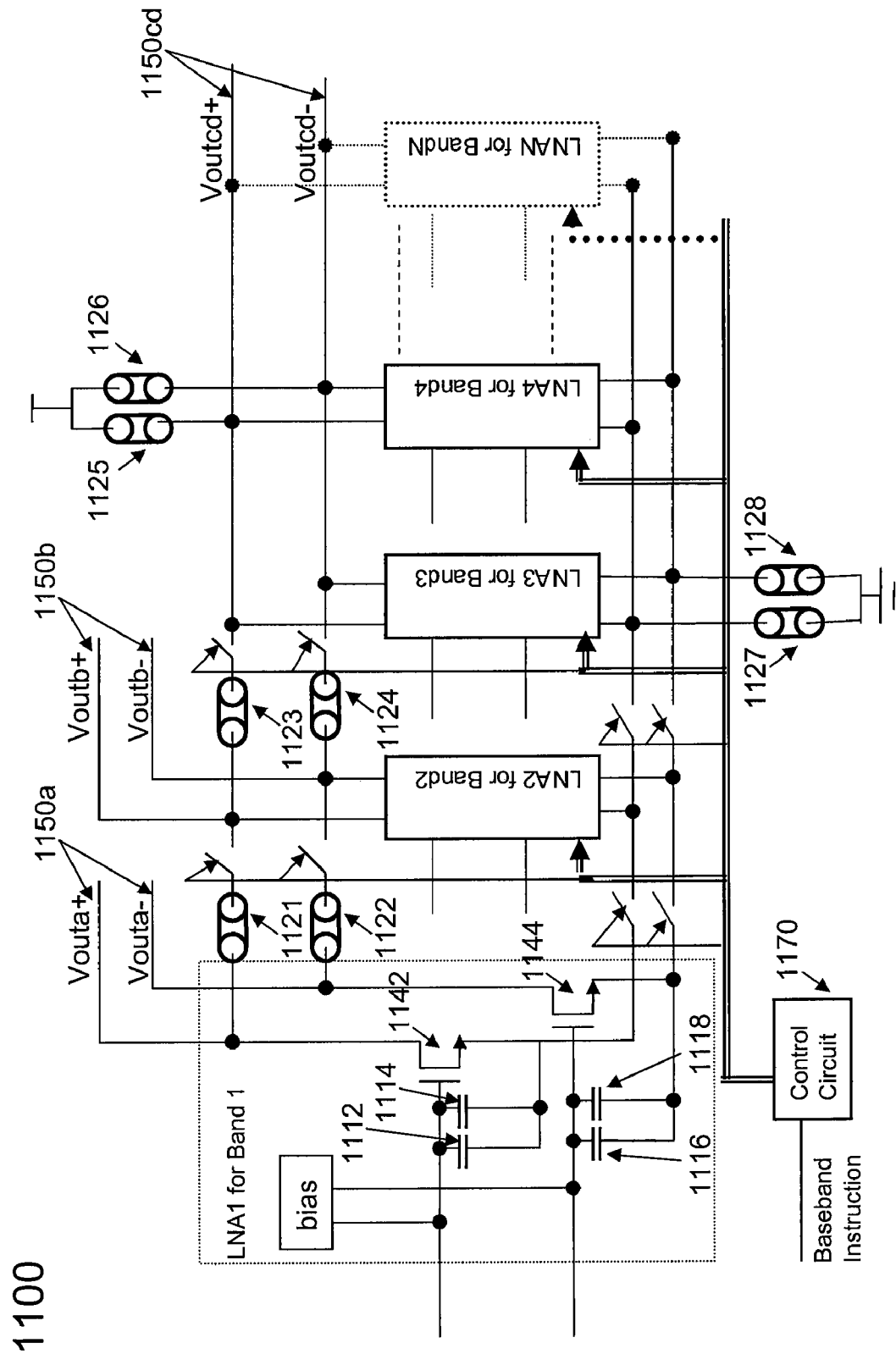
FIG. 11 is a schematic of an example of a circuit employing switched load inductor sharing and source degeneration inductor sharing with switched load capacitors for a multi-band communication system.

FIG. 11 is an example schematic of a circuit 1100 employing switched load inductor sharing and source degeneration inductor sharing with switched gate-source capacitors. FIG. 11 uses a combination of techniques of switched load capacitors as shown, for example, in FIG. 4 and switched source degeneration inductors as shown, for example, in FIG. 8A, for a multi-band communication system with LNAs for N frequency bands. FIG. 11 can be particularly useful where center frequencies of all N frequency bands far enough apart to exceed their respective limiting frequency bandwidth. The circuit 1100 includes LNA1-LNAN, a control circuit 1170 for controlling the switches, a dedicated output for the LNAs using dedicated source inductor 1150a and 1150b and a shared output 1150cd for the other LNAs.

Transistors 1142 and 1144 represent LNA1, which uses a bias circuit (not labeled), gate-source capacitors 1112-1118 followed by switches (not labeled), dedicated load inductors 1121-1122, shared load inductors 1123 and 1126, and shared source degeneration inductors 1127 and 1128. LNA2 (not labeled) can use similar elements except for not using dedicated load inductors 1121 and 1122. LNA3-LNAN can also use similar elements without the dedicated and shared load inductors 1121-1124 (as shown) or with progressively smaller shared load inductors (not shown) and with progressively smaller capacitances for the gate-source capacitors (not shown for LNA2-LNAN).

When an LNA is activated using switching techniques discussed above, the respective switches are closed to connect the respective dedicated and shared load inductors (e.g., dedicated and shared load inductors 1121-1124 for LNA1 or shared load inductors 1123 and 1124 for LNA2) to the shared load inductors 1125 and 1126 and the gate-source capacitors of the LNA (e.g., gate-source capacitors 1112-1118 of LNA1) to the shared source degeneration inductors 1127 and 1128, for the respective frequency.

Figure 12:
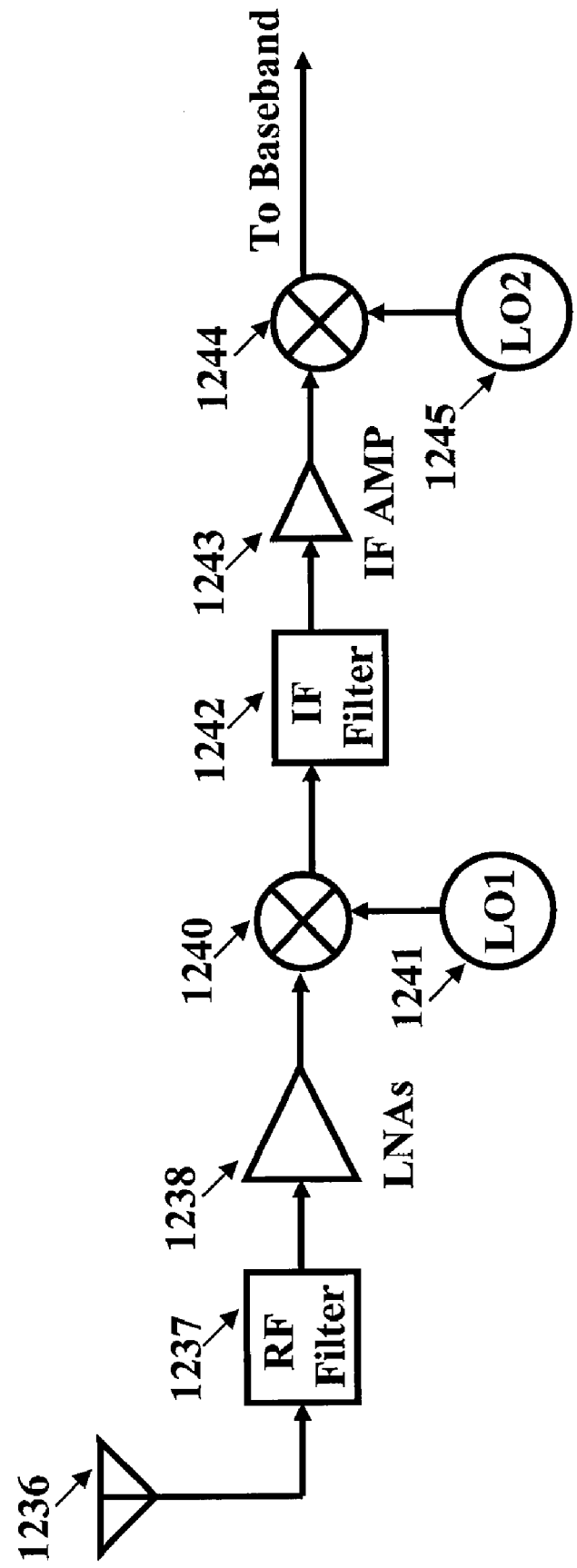
FIG. 12 is a schematic of an example of a low-intermediate frequency (IF) receiver.
Figure 13:
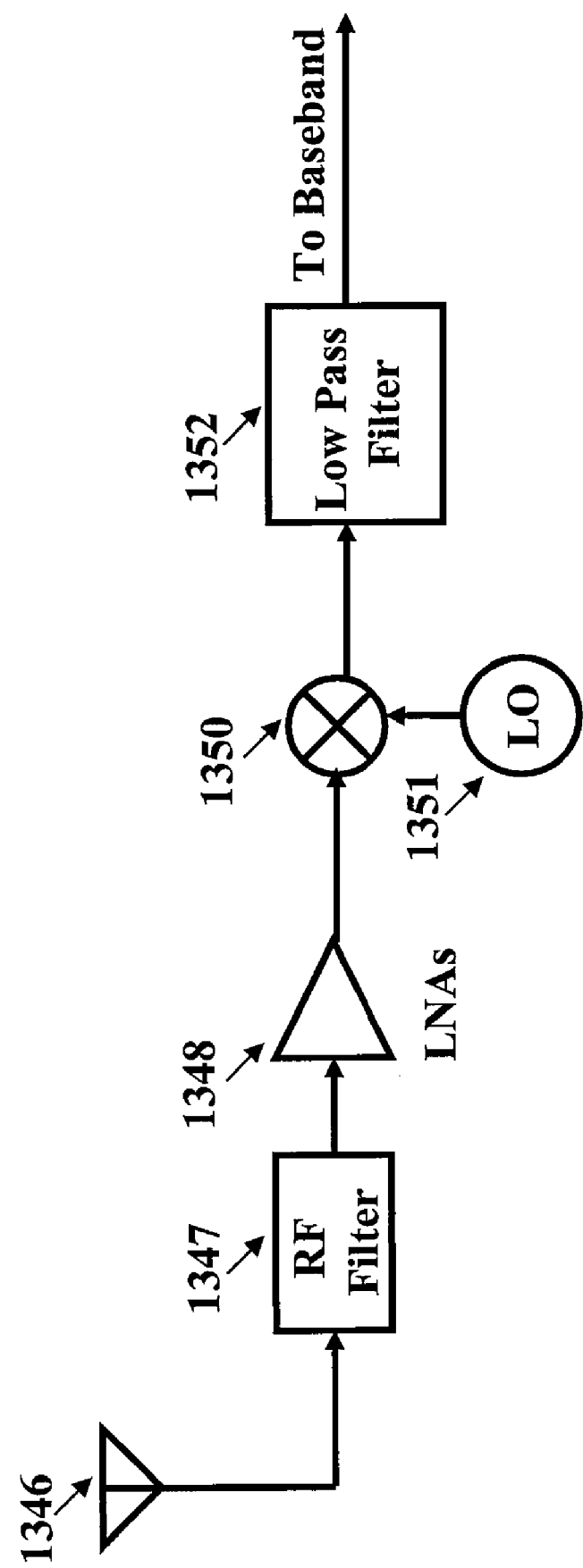
FIG. 13 is a schematic of an example of a direct-conversion receiver.

The disclosed techniques can be used with wireless communication systems. For example, the disclosed techniques can be used with receivers and transceivers, such as the receiver, and/or transceiver architectures for superheterodyne receivers, image-rejection (e.g., Hartley, Weaver) receivers, zero-intermediate frequency (IF) receivers, low-IF receivers, direct-up transceivers, two-step up transceivers, and other types of receivers and transceivers for wireless and wireline technologies. FIGS. 12 and 13 are schematics demonstrating two examples of systems in which the inductor sharing techniques described above can be used.

FIG. 12 is an example schematic of a low-intermediate frequency (IF) multi-band receiver 1200 with LNAs 1238 employing inductor sharing techniques described above, separately or in combination. An RF signal arriving at an antenna 1236 passes through one or more RF filters 1237, a selected low noise amplifier (LNA) 1238 that has a set of two or more LNAs with each LNA dedicated to a frequency band employing inductor sharing techniques of shared load inductors and source degeneration inductors with or without switched load or gate-source capacitors, separately or in combination. For example, in various implementations, the LNAs 1238 can share inductors connected to the source of the LNA's metal-oxide semiconductor field effect transistors (MOSFETs) or other transistors. In some implementations, the LNAs 1238 can share inductors connected to the drain and the source of the LNA's metal-oxide semiconductor field effect transistors (MOSFETs) or other transistors.

The RF signal then enters a first set of one or more mixers 1240, which performs image rejection and translates the RF signal down to an intermediate frequency by mixing it with the signal produced by a first local oscillator (LO) LO1 1241. The undesired mixer products in the IF signal are rejected by one or more additional IF filters 1242. The filtered IF signal then enters one or more IF amplifier stages 1243, after which the output feeds into a second mixer 1244 that translates it down to yet another intermediate frequency by mixing it with the signal produced by a second LO LO2 1245. The signal is then sent to the baseband for processing by the remainder of the communication system. Tuning into a particular channel within the band-limited RF signal is accomplished by varying the frequency of each LO 1241 and 1245.

In another example, FIG. 13 is a schematic of a direct-conversion multi-band receiver 1300. An antenna 1346 couples an RF signal through one or more bandpass RF filters 1347 into a selected LNA of a set of two or more LNAs 1348 with each LNA dedicated to a frequency band. The two or more LNAs 1348 can use the inductor sharing techniques described above, including shared load inductors and source degeneration inductors with or without switched load or gate-source capacitors, separately or in combination. For example, in various implementations, the LNAs 1348 can share inductors connected to the source of the LNA's MOSFETs or other transistors. In other implementations, the LNAs 1348 can share inductors connected to the drain and the source of the LNA's metal-oxide semiconductor field effect transistors (MOSFETs) or other transistors.

The signal then enters a set of one or more mixers 1350 and mixes with an LO frequency produced by an LO 1351. The one or more mixers 1350 output is coupled into a one or more low-pass filters 1352 before proceeding into a baseband for use by the remainder of the communications system.

In some implementations, circuit components can be exchanged from the disclosed figures with minimal change in circuit functionality. Various topologies for circuit models can be used. The exemplary designs can use various process technologies, such as CMOS or BiCMOS (Bipolar-CMOS) process technology, or Silicon Germanium (SiGe) technology. The circuits can be single-ended or fully-differential circuits.

The system can include other components. Some of the components can include computers, processors, clocks, radios, signal generators, counters, test and measurement equipment, function generators, oscilloscopes, phase-locked loops, frequency synthesizers, phones, wireless communication devices, and components for the production and transmission of audio, video, and other data. The number and order of variable gain and filter stages can vary. In addition the number of controllable steps, as well as the steps sizes of each of the stages of gain can also vary.

A number of implementations have been described. Nevertheless, it will be understood that various modifications may be made. Accordingly, other implementations are within the scope of the following claims

What is claimed:

1. A method comprising:
    receiving a first input signal at a first terminal of a first amplifier;
    amplifying the first input signal using the first amplifier, wherein the first amplifier is coupled to one or more source degeneration inductors at a second terminal of the first amplifier and to one or more load inductors at a third terminal of the first amplifier;
    receiving a second input signal at a first terminal of a second amplifier;
    amplifying the second input signal using the second amplifier, wherein the second amplifier is coupled to the one or more source degeneration inductors at a second terminal of the second amplifier and to the one or more load inductors at a third terminal of the second amplifier;
    receiving a third input signal at a first terminal of a third amplifier;
    amplifying the third input signal using the third amplifier, wherein the third amplifier is coupled to the one or more source degeneration inductors at a second terminal of the third amplifier and is coupled to the one or more load inductors at a third terminal of the third amplifier;
    receiving a fourth input signal at a first terminal of a fourth amplifier; and
    amplifying the fourth input signal using the fourth amplifier, wherein the fourth amplifier is coupled to the one or more source degeneration inductors at a second terminal of the fourth amplifier and is coupled to the one or more load inductors at a third terminal of the fourth amplifier,
    wherein the one or more source degeneration inductors is coupled to the second terminal of the third amplifier and the second terminal of the fourth amplifier through one or more switches.

2. The method of claim 1 wherein the third terminal of the first amplifier is coupled to the third terminal of the second amplifier.

3. The method of claim 1 wherein the one or more load inductors is coupled to the third terminal of the third amplifier and the third terminal of the fourth amplifier through one or more switches.

4. The method of claim 1 wherein the third terminal of the third amplifier and the third terminal of the fourth amplifier are coupled to one or more load capacitors through one or more switches.

5. The method of claim 1 wherein the second terminal of the third amplifier and the second terminal of the fourth amplifier are coupled to one or more gate-source capacitors through one or more switches.

6. The method of claim 1 wherein the one or more source degeneration inductors is a first set of one or more source degeneration inductors, the third amplifier is coupled to a second set of one or more source degeneration inductors at a second terminal of the third amplifier, and the fourth amplifier is coupled to the second set of one or more source degeneration inductors at a second terminal of the fourth amplifier.

7. The method of claim 6 wherein the second set of one or more source degeneration inductors is coupled to the first set of one or more source degeneration inductors through one or more switches.

8. The method of claim 1 wherein the one or more load inductors is a first set of one or more load inductors, the third amplifier is coupled to a second set of one or more load inductors at a third terminal of the third amplifier, and the fourth amplifier is coupled to the second set of one or more load inductors at a third terminal of the fourth amplifier.

9. The method of claim 8 wherein the second set of one or more load inductors is coupled to the first set of one or more load inductors through one or more switches.

10. The method of claim 1 wherein:
the one or more source degeneration inductors is a first set of one or more source degeneration inductors, the third amplifier is coupled to a second set of one or more source degeneration inductors at a second terminal of the third amplifier, and the fourth amplifier is coupled to the second set of one or more source degeneration inductors at a second terminal of the fourth amplifier; and
the one or more load inductors is a first set of one or more load inductors, the third amplifier is coupled to a second set of one or more load inductors at a third terminal of the third amplifier, and the fourth amplifier is coupled to the second set of one or more load inductors at a third terminal of the fourth amplifier,
wherein the second terminal of the first amplifier is coupled to the second terminal of the second amplifier, the third terminal of the first amplifier is coupled to the third terminal of the second amplifier, the second terminal of the third amplifier is coupled to the second terminal of the fourth amplifier, and the third terminal of the third amplifier is coupled to the third terminal of the fourth amplifier.

11. The method of claim 1 further comprising disabling the first amplifier during a time period in which the second amplifier is amplifying the second input signal.

12. The method of claim 11 wherein disabling the first amplifier includes switching the first terminal of the first amplifier to ground.

13. The method of claim 11 wherein amplifying the first or second input signals includes using a control circuit, wherein the control circuit is configured to control a first switch such that the first amplifier is active concurrent with controlling a second switch such that that the second amplifier is not active.

14. The method of claim 13 wherein the control circuit is configured to not activate the first amplifier and the second amplifier concurrently.

15. The method of claim 1 wherein amplifying the first input signal using the first amplifier includes amplifying the first input signal only at times when the second amplifier is not active.

16. The method of claim 1 wherein the first amplifier is dedicated to a first frequency band and the second amplifier is dedicated to a second, different, frequency band.

17. The method of claim 1 wherein the first and second amplifiers are low noise amplifiers.

18. The method of claim 1 wherein the second terminal of the first amplifier is coupled to the second terminal of the second amplifier and the third terminal of the first amplifier is coupled to the third terminal of the second amplifier.

19. A method comprising:
coupling a first input terminal to a first terminal of a first amplifier;
coupling at least one source degeneration inductor to a second terminal of the first amplifier;
coupling a second input terminal to a first terminal of a second amplifier;
coupling the at least one source degeneration inductor to a second terminal of the second amplifier; and
coupling at least one load inductor to a third terminal of the first amplifier and to a third terminal of the second amplifier,
wherein the first and second input terminals are each differential input terminals, the first terminal of the first amplifier is a differential terminal, and the first terminal of the second amplifier is a differential terminal.

20. The method of claim 19 further comprising:
coupling a third input terminal to a first terminal of a third amplifier;
coupling the at least one load inductor to the third amplifier;
coupling the at least one source degeneration inductor to the third amplifier;
coupling a fourth input terminal to a first terminal of a fourth amplifier;
coupling the at least one load inductor to the fourth amplifier; and
coupling the at least one source degeneration inductor to the fourth amplifier.

21. The method of claim 20 wherein the at least one load inductor is a first set of one or more load inductors, the third amplifier is coupled to a second set of one or more load inductors at a third terminal of the third amplifier, and the fourth amplifier is coupled to the second set of one or more load inductors at a third terminal of the fourth amplifier.

22. The method of claim 21 wherein the second set of one or more load inductors is coupled to the first set of one or more load inductors through one or more switches.

23. The method of claim 20 wherein the at least one load inductor is coupled to the third terminal of the third amplifier and the third terminal of the fourth amplifier through one or more switches.

24. The method of claim 20 wherein the at least one source degeneration inductor is a first set of one or more source degeneration inductors, the third amplifier is coupled to a second set of one or more source degeneration inductors at a second terminal of the third amplifier, and the fourth amplifier is coupled to the second set of one or more source degeneration inductors at a second terminal of the fourth amplifier.

25. The method of claim 24 wherein the second set of one or more source degeneration inductors is coupled to the second terminal of the third amplifier and the second terminal of the fourth amplifier through one or more switches.

26. The method of claim 20 wherein a second terminal of the fourth amplifier is coupled to a second terminal of the third amplifier and the at least one source degeneration inductor through one or more switches.

27. The method of claim 20 wherein at least one load inductor is a first set of one or more load inductors, the third amplifier is coupled to a second set of one or more load inductors at a third terminal of the third amplifier, and the fourth amplifier is coupled to the second set of one or more load inductors at a third terminal of the fourth amplifier; and
the at least one source degeneration inductor is a first set of one or more source degeneration inductors, the third amplifier is coupled to a second set of one or more source degeneration inductors at a second terminal of the third amplifier, and the fourth amplifier is coupled to the second set of one or more source degeneration inductors at a second terminal of the fourth amplifier,
wherein the second terminal of the first amplifier is coupled to the second terminal of the second amplifier, the third terminal of the first amplifier is coupled to the third terminal of the second amplifier, the second terminal of the third amplifier is coupled to the second terminal of the fourth amplifier, and the third terminal of the third amplifier is coupled to the third terminal of the fourth amplifier.

28. The method of claim 19 wherein the first amplifier is dedicated to a first frequency band and the second amplifier is dedicated to a second, different, frequency band.

29. The method of claim 19 further comprising:
coupling a first output of a control circuit to a first switch, wherein the control circuit is configured to use the first switch to switch between coupling or not coupling the first terminal of the first amplifier to ground; and
coupling a second output of the control circuit to a second switch, wherein the control circuit is configured to use the second switch to switch between coupling or not coupling the first terminal of the second amplifier to ground.

30. The method of claim 29 wherein the control circuit is configured to always couple at least one of the first terminal of the first amplifier and the first terminal of the second amplifier to ground.

31. The method of claim 19 wherein the first and the second amplifiers are low noise amplifiers.

32. The method of claim 19 wherein coupling the at least one load inductor to the third terminal of the first amplifier and the third terminal of the second amplifier includes coupling a pair of load inductors to a third differential terminal of the first amplifier and a third differential terminal of the second amplifier.

33. The method of claim 32 wherein coupling the at least one source degeneration inductor to the second terminal of the first amplifier and the second terminal of the second amplifier includes coupling a pair of source degeneration inductors to a second differential terminal of the first amplifier and a second differential terminal of the second amplifier.

34. The method of claim 19 further comprising coupling the second terminal of the first amplifier to the second terminal of the second amplifier.

35. A circuit comprising:
a first terminal of a first amplifier coupled to a first input terminal;
at least one source degeneration inductor coupled to a second terminal of the first amplifier;
a first terminal of a second amplifier coupled to a second input terminal;
a second terminal of the second amplifier coupled to the at least one source degeneration inductor; and
at least one load inductor coupled to a third terminal of the first amplifier and a third terminal of the second amplifier,
wherein the first and second input terminals are differential input terminals, the first terminal of the first amplifier is a differential terminal, and the first terminal of the second amplifier is a second differential terminal.

36. The circuit of claim 35 wherein the at least one source degeneration inductor is coupled to the second terminal of the first amplifier and the second terminal of the second amplifier through one or more switches.

37. The circuit of claim 35 further comprising:
a first terminal of a third amplifier coupled to a third input terminal, wherein the third amplifier is coupled to the at least one source degeneration inductor and is coupled to the at least one load inductor; and
a first terminal of a fourth amplifier coupled to a fourth input terminal, wherein the fourth amplifier is coupled to the at least one source degeneration inductor and is coupled to the at least one load inductor.

38. The circuit of claim 37 wherein a second terminal of the third amplifier and a second terminal of the fourth amplifier are coupled to one or more gate-source capacitors through one or more switches.

39. The circuit of claim 37 wherein a third terminal of the third amplifier and a third terminal of the fourth amplifier are coupled to one or more load capacitors through one or more switches.

40. The circuit of claim 37 wherein the at least one load inductor is a first set of one or more load inductors, the third amplifier is coupled to a second set of one or more load inductors at a third terminal of the third amplifier, and the fourth amplifier is coupled to the second set of one or more load inductors at a third terminal of the fourth amplifier.

41. The circuit of claim 40 wherein the second set of one or more load inductors is coupled to the first set of one or more load inductors through one or more switches.

42. The circuit of claim 37 wherein the at least one load inductor is coupled to a third terminal of the third amplifier and a third terminal of the fourth amplifier through one or more switches.

43. The circuit of claim 37 wherein the at least one source degeneration inductor is a first set of one or more source degeneration inductors, the third amplifier is coupled to a second set of one or more source degeneration inductors at the second terminal of the third amplifier, and the fourth amplifier is coupled to the second set of one or more source degeneration inductors at the second terminal of the fourth amplifier.

44. The circuit of claim 43 wherein the second set of one or more source degeneration inductors is coupled to the first set of one or more source degeneration inductors through one or more switches.

45. The circuit of claim 43 wherein the second set of one or more source degeneration inductors is coupled to the second terminal of the third amplifier and the second terminal of the fourth amplifier through one or more switches.

46. The circuit of claim 37 wherein:
the at least one load inductor is a first set of one or more load inductors, the third amplifier is coupled to a second set of one or more load inductors at a third terminal of the third amplifier, and the fourth amplifier is coupled to the second set of one or more load inductors at a third terminal of the fourth amplifier; and
the one or more source degeneration inductors is a first set of one or more source degeneration inductors, the third amplifier is coupled to a second set of one or more source degeneration inductors at a second terminal of the third amplifier, and the fourth amplifier is coupled to the second set of one or more source degeneration inductors at a second terminal of the fourth amplifier,
wherein the second terminal of the first amplifier is coupled to the second terminal of the second amplifier, the third terminal of the first amplifier is coupled to the third terminal of the second amplifier, the second terminal of the third amplifier is coupled to the second terminal of the fourth amplifier, and the third terminal of the third amplifier is coupled to the third terminal of the fourth amplifier.

47. The circuit of claim 46 wherein the second set of one or more load inductors is coupled to the first set of one or more load inductors through one or more load inductor switches and the second set of one or more source degeneration inductors is coupled to the first set of one or more source degeneration inductors through one or more source inductor switches.

48. The circuit of claim 37 further comprising:
- a control circuit with an input terminal coupled to a baseband to receive instructions from the baseband;
- a first switch coupled to the control circuit and configured to switch between coupling or not coupling the first terminal of the first amplifier to ground; and
- a second switch coupled to the control circuit and configured to switch between coupling or not coupling the first terminal of the second amplifier to ground.

49. The circuit of claim 48 wherein the control circuit is configured to always couple at least one of the first terminal of the first amplifier and the first terminal of the second amplifier to ground when amplification is being conducted.

50. The circuit of claim 48 wherein the control circuit is configured to control the first switch such that the first amplifier is active concurrently with controlling the second switch such that that the second amplifier is not active.

51. The circuit of claim 48 wherein the control circuit is configured to not activate the first amplifier and the second amplifier concurrently.

52. The circuit of claim 35 wherein the first and the second amplifiers are low noise amplifiers.

53. The circuit of claim 35 wherein the first amplifier is dedicated to a first frequency band and the second amplifier is dedicated to a second, different, frequency band.

54. The circuit of claim 35 wherein the second terminal of the first amplifier is coupled to the second terminal of the second amplifier and the third terminal of the first amplifier is coupled to the third terminal of the second amplifier.

* * * * *

UNITED STATES PATENT AND TRADEMARK OFFICE
CERTIFICATE OF CORRECTION

PATENT NO.        : 7,705,682 B2
APPLICATION NO.   : 12/237132
DATED             : April 27, 2010
INVENTOR(S)       : Minzhan Gao et al.

Page 1 of 1

It is certified that error appears in the above-identified patent and that said Letters Patent is hereby corrected as shown below:

Column 21, line 46, please delete "that that" and insert therefor --that--.

Column 26, line 2, please delete "that that" and insert therefor --that--.

Signed and Sealed this

Twenty-ninth Day of June, 2010

David J. Kappos
*Director of the United States Patent and Trademark Office*